United States Patent
Lee

(10) Patent No.: US 10,305,474 B2
(45) Date of Patent: May 28, 2019

(54) HIGH VOLTAGE OUTPUT DRIVER WITH LOW VOLTAGE DEVICES

(71) Applicant: SK hynix Inc., Icheon-si, Gyeonggi-do (KR)

(72) Inventor: Seung Ho Lee, Icheon-si (KR)

(73) Assignee: SK Hynix Inc., Icheon-si, Gyeonggi-do (KR)

( * ) Notice: Subject to any disclaimer, the term of this patent is extended or adjusted under 35 U.S.C. 154(b) by 104 days.

(21) Appl. No.: 15/471,861

(22) Filed: Mar. 28, 2017

(65) Prior Publication Data
US 2018/0109255 A1  Apr. 19, 2018

(30) Foreign Application Priority Data
Oct. 13, 2016  (KR) .......................... 10-2016-0132936

(51) Int. Cl.
*H03K 17/687* (2006.01)
*H03K 19/003* (2006.01)
*H03K 19/0175* (2006.01)

(52) U.S. Cl.
CPC ... *H03K 17/6872* (2013.01); *H03K 19/00315* (2013.01); *H03K 19/017509* (2013.01)

(58) Field of Classification Search
CPC ......... H03K 17/6872; H03K 19/00315; H03K 19/017509
USPC .................................................. 327/108–112
See application file for complete search history.

(56) References Cited

U.S. PATENT DOCUMENTS

| | | | |
|---|---|---|---|
| 5,966,026 A | 10/1999 | Partovi et al. | |
| 7,027,332 B2 * | 4/2006 | Kuo ..................... | G11C 7/1051 326/83 |
| 2010/0073349 A1 * | 3/2010 | Ishii ....................... | G09G 3/346 345/211 |

* cited by examiner

*Primary Examiner* — Lincoln D Donovan
*Assistant Examiner* — Diana J. Cheng
(74) *Attorney, Agent, or Firm* — William Park & Associates Ltd.

(57) ABSTRACT

A high voltage output driver may be provided. The high voltage output driver may include a pull-up driver and a pull-down driver. The high voltage output driver may include a first driver boosting control logic circuit configured to apply a first bias control signal to the pull-up driver. The high voltage output driver may include a second driver boosting control logic circuit configured to apply a second bias control signal to the pull-down driver.

19 Claims, 15 Drawing Sheets

HIGH VOLTAGE OUTPUT DRIVER WITH LOW VOLTAGE DEVICES

CROSS-REFERENCE TO RELATED APPLICATIONS

The present application claims priority under 35 U.S.C 119(a) to Korean Application No. 10-2016-0132936, filed on Oct. 13, 2016, which is herein incorporated by references in its entirety.

BACKGROUND

1. Technical Field

Various embodiments of the present disclosure may generally relate to driving circuits of semiconductor devices and, more particularly, to high voltage output drivers with low voltage devices.

2. Related Art

System-on-chips (SOCs) have required fast interface circuits operating at a low supply voltage. In response to such a requirement, a triple gate oxide (TGO) process technique has been applied to the fabrication of the SOCs. Each of the SOCs fabricated using the triple gate oxide process technique may consist of three kinds of MOS transistors. One of the three kinds of MOS transistors are formed to have a relatively thin gate oxide suitable for a low voltage operation performance in core regions, another of the three kinds of MOS transistors are formed to have a normal gate oxide suitable for a medium voltage operation for performance in the peripheral regions, and the other of the three kinds of MOS transistors are formed to have a relatively thick gate oxide suitable for a high voltage operation performance in the input and output (input/output) (I/O) circuits (e.g., I/O buffer circuits). Recently, however, as semiconductor devices of the SOCs become more highly integrated, a dual gate oxide (DGO) process technique instead of the TGO process technique has been applied to fabrication of the SOCs to avoid these complicated processes. That is, MOS transistors having a relatively thin gate oxide suitable for a low voltage operation of the core regions and MOS transistors having a relatively thick gate oxide suitable for a high voltage operation of the peripheral regions including the I/O buffer regions have been employed in the semiconductor devices of the SOCs. For example, if process techniques for realizing fine patterns having a line width of 32 nanometers or less are applied to fabrication of the semiconductor devices, MOS transistors having a thin gate oxide suitable for a 0.9-volt operation and MOS transistors having a thick gate oxide suitable for a 1.8-volt operation or a 2.5-volt operation have been used in the semiconductor devices.

If only the MOS transistors for a 2.5-volt operation are used in the semiconductor devices, there may be some limitations in supporting a fast interface employing a serial advanced technology attachment (SATA) scheme or a double data rate 3 (DDR3) scheme because of a low performance operation of the MOS transistors for a 2.5-volt operation. In the event that only the MOS transistors for a 0.9-volt operation or a 1.8-volt operation are used in the semiconductor devices, the reliability of the MOS transistors for a 0.9-volt operation or a 1.8-volt operation may not be guaranteed if a high voltage interface operation (e.g., a 3.3 volt interface operation) used in an ATA scheme or a consumer electronics ATA (CE-ATA) scheme is performed. Thus, in such a case, it may be necessary to use the MOS transistors for a 0.9-volt operation as default transistors and to provide an input/output (I/O) interface circuit which is capable of selectively supporting the MOS transistors for a 1.8-volt operation or a 2.5-volt operation.

Recently, all of a low voltage corresponding to a core voltage of about 0.9 volts, a medium voltage corresponding to a first I/O voltage of about 1.8 volts, and a high voltage corresponding to a second I/O voltage of about 3.3 volts have been used in driving output drivers to support all kinds of interface protocols operating in a wide range supply voltage. In such a case, a dual gate oxide (DGO) process technique is used in realizing the cell transistors constituting an internal circuit with low voltage MOS transistors having a relatively thin gate oxide layer as well as for realizing interface solution devices for medium and high voltage operations with medium voltage MOS transistors having a relatively thick gate oxide layer. However, as described above, the reliability of the medium voltage MOS transistors is not guaranteed if a high voltage interface operation condition is applied to the medium voltage MOS transistors. In particular, while a voltage applied to pads of the output drivers changes from a low voltage into a high voltage or vice versa to trigger the output drivers, the medium voltage MOS transistors included in the output drivers may be damaged due to the high voltage.

SUMMARY

According to an embodiment, a high voltage output driver may be provided. The high voltage output driver may include a pull-up driver and a pull-down driver. The high voltage output driver may include a first driver boosting control logic circuit configured to apply a first bias control signal to the pull-up driver. The high voltage output driver may include a second driver boosting control logic circuit configured to apply a second bias control signal to the pull-down driver.

Figure 8:
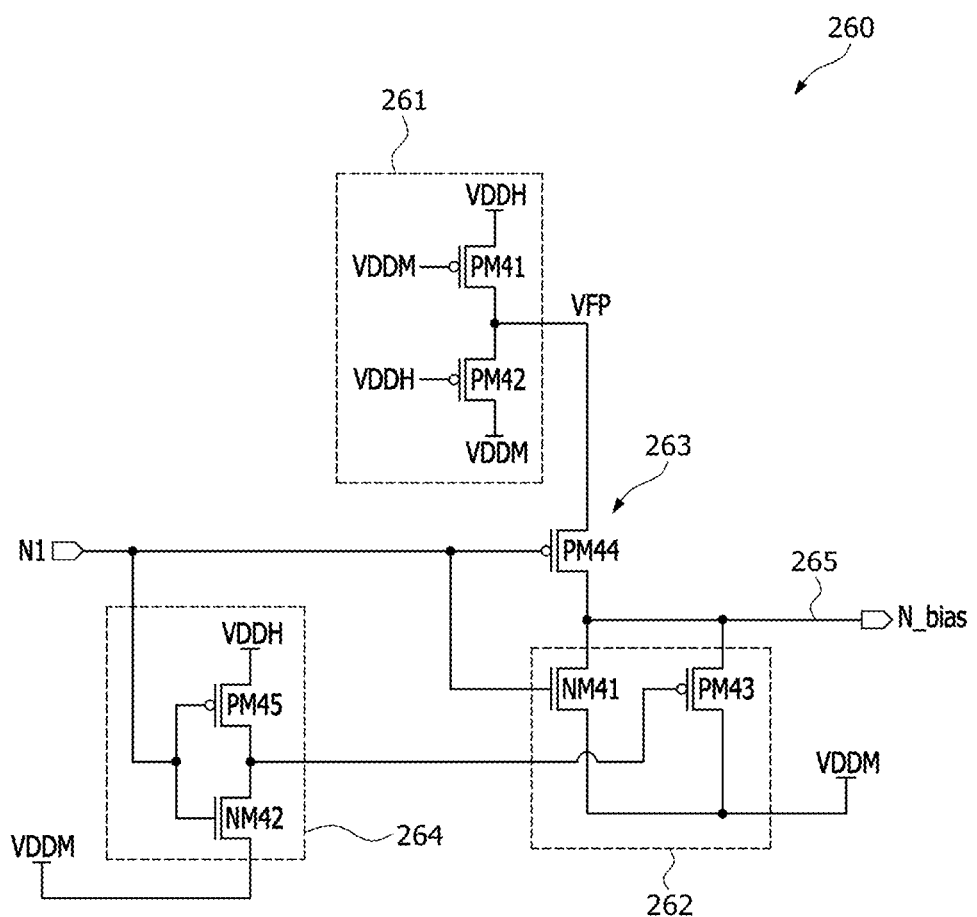
FIG. 8 is a circuit diagram illustrating an example of a second driver boosting control logic circuit included in the high voltage output driver of FIG. 3.

7 and an operation of the second driver boosting control logic circuit illustrated in FIG. 8.

Figure 3:
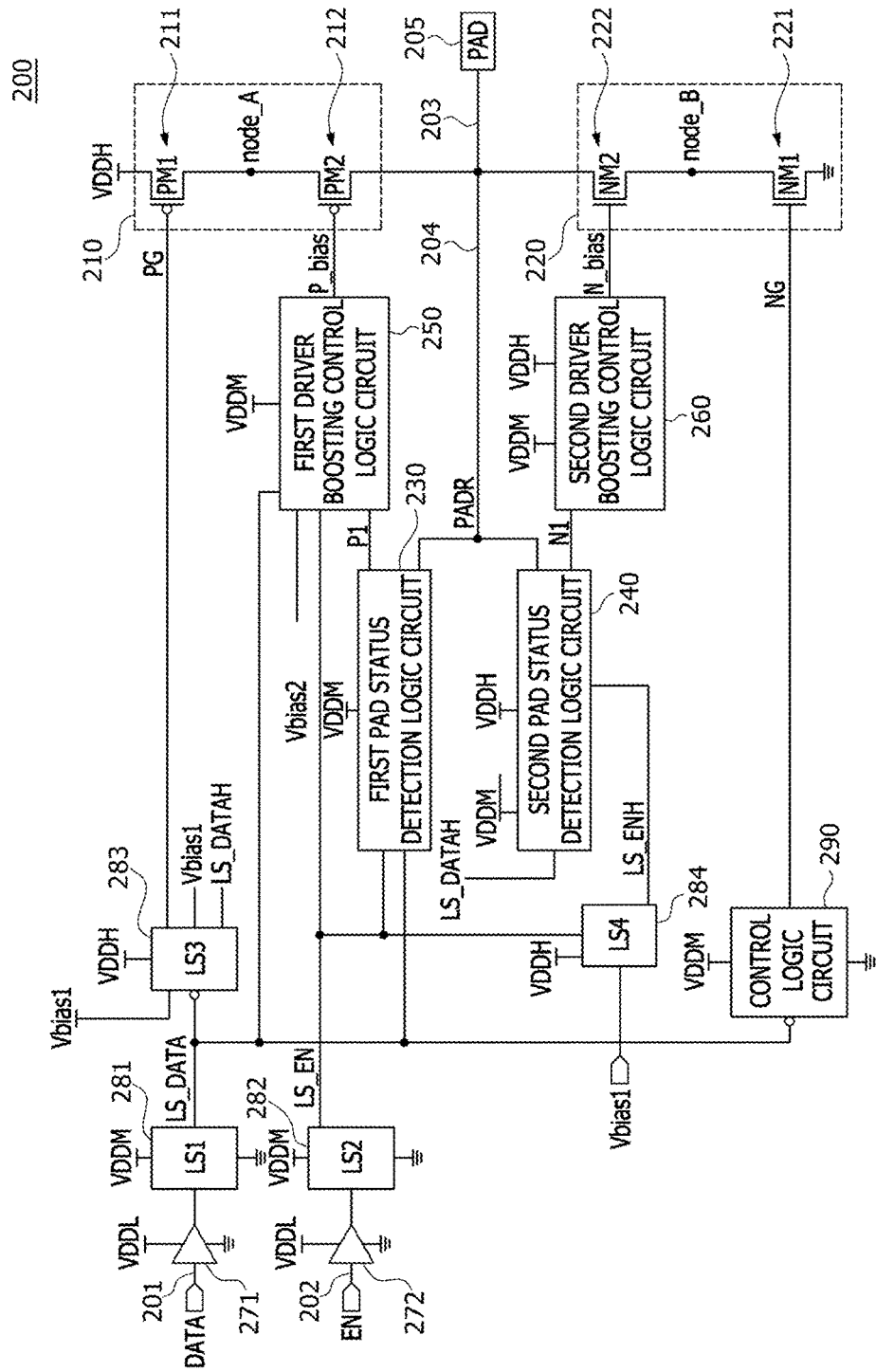
FIG. 3 is a block diagram illustrating a high voltage output driver according to an embodiment of the present disclosure.
Figure 10:
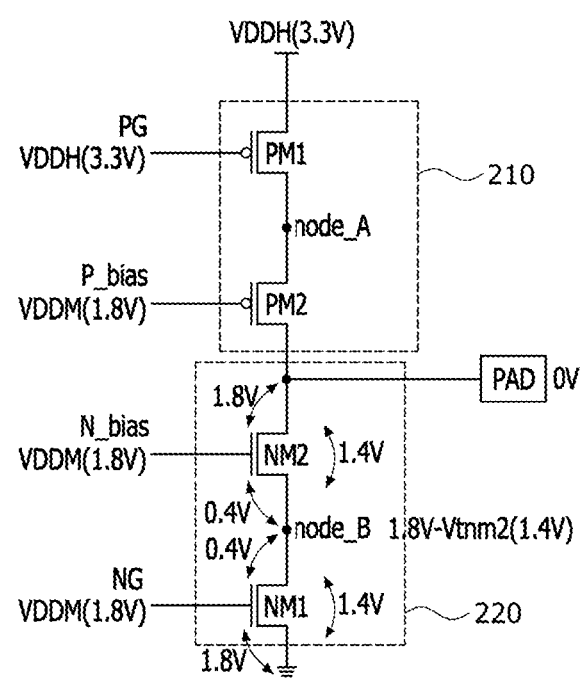

FIG. 10 is a circuit diagram illustrating bias voltages applied between terminals of a first NMOS transistor and a second NMOS transistor constituting a pull-down driver included in the high voltage output driver of FIG. 3 when a data signal maintains a low level signal and a pad signal maintains a ground voltage.

Figure 11:
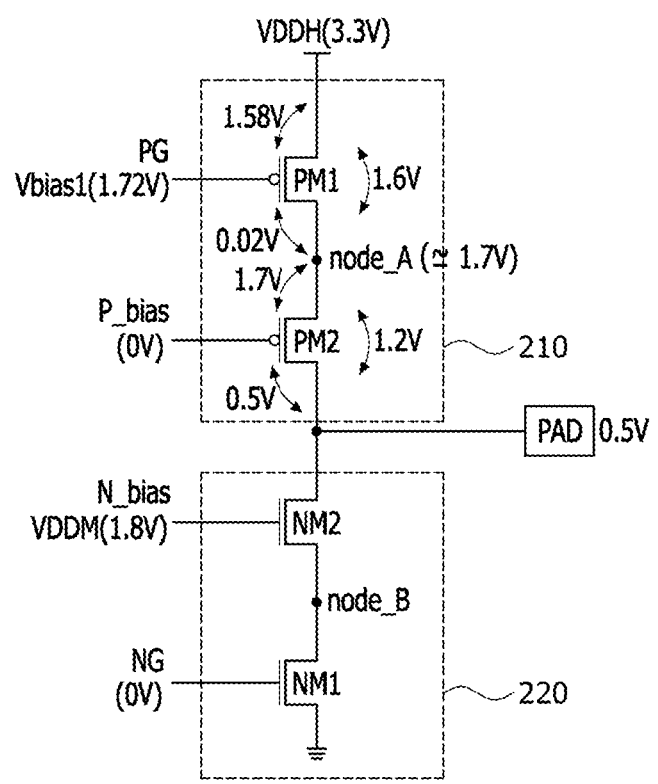
Figure 12:
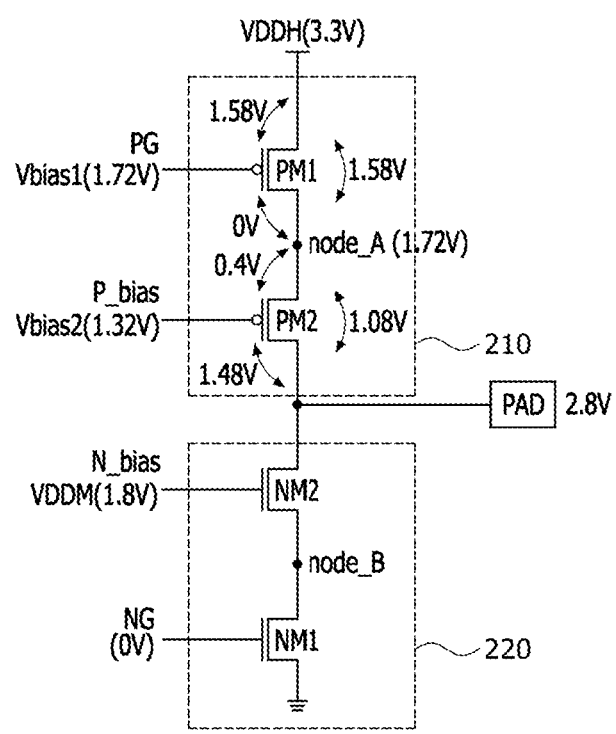

FIGS. 11 and 12 are circuit diagrams illustrating bias voltages applied between terminals of a first PMOS transistor and a second PMOS transistor constituting a pull-up driver included in the high voltage output driver of FIG. 3 while a data signal changes from a low level signal into a high level signal and a pad signal changes from a ground voltage into a high voltage.

Figure 13:
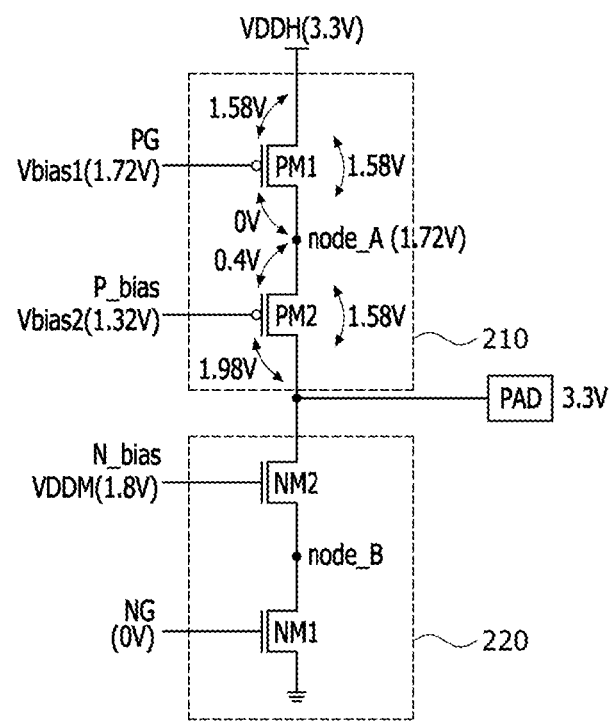

FIG. 13 is a circuit diagram illustrating bias voltages applied between terminals of a first PMOS transistor and a second PMOS transistor constituting a pull-up driver included in the high voltage output driver of FIG. 3 when a data signal maintains a high level signal and a pad signal maintains a high voltage.

Figure 14:
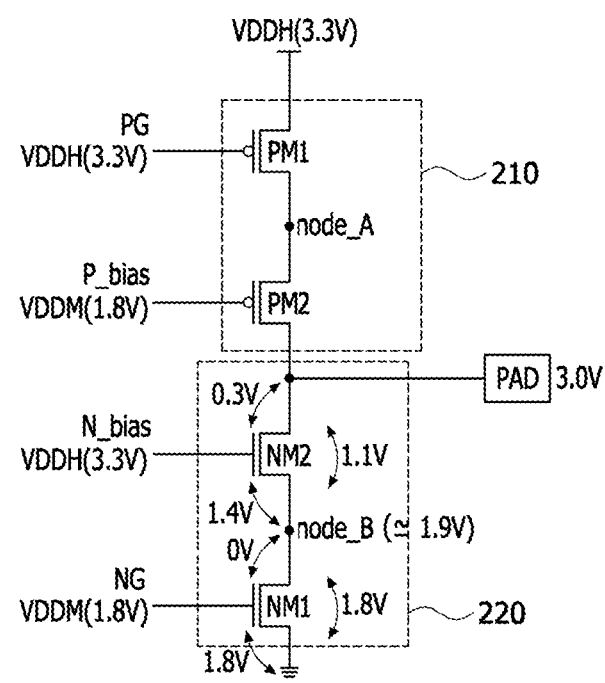
Figure 15:
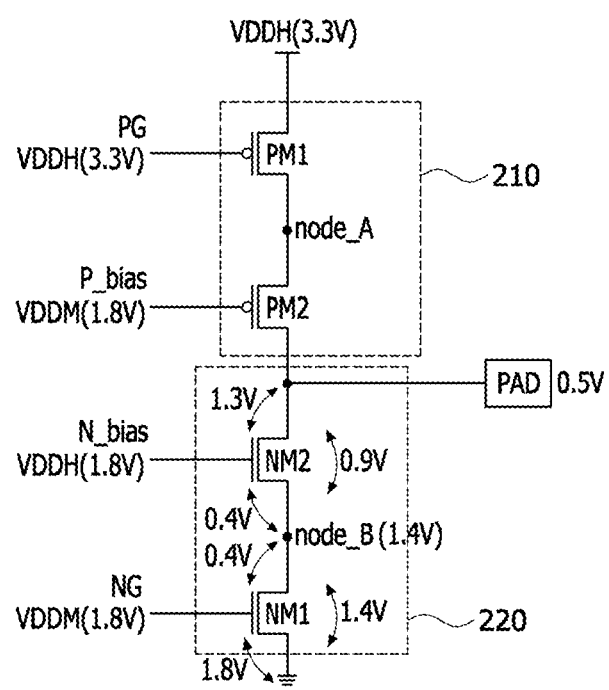

FIGS. 14 and 15 are circuit diagrams illustrating bias voltages applied between terminals of a first NMOS transistor and a second NMOS transistor constituting a pull-down driver included in the high voltage output driver of FIG. 3 while a data signal changes from a high level signal into a low level signal and a pad signal changes from a high voltage into a ground voltage.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments may be directed to high voltage output drivers realized using low voltage devices.

Figure 1:
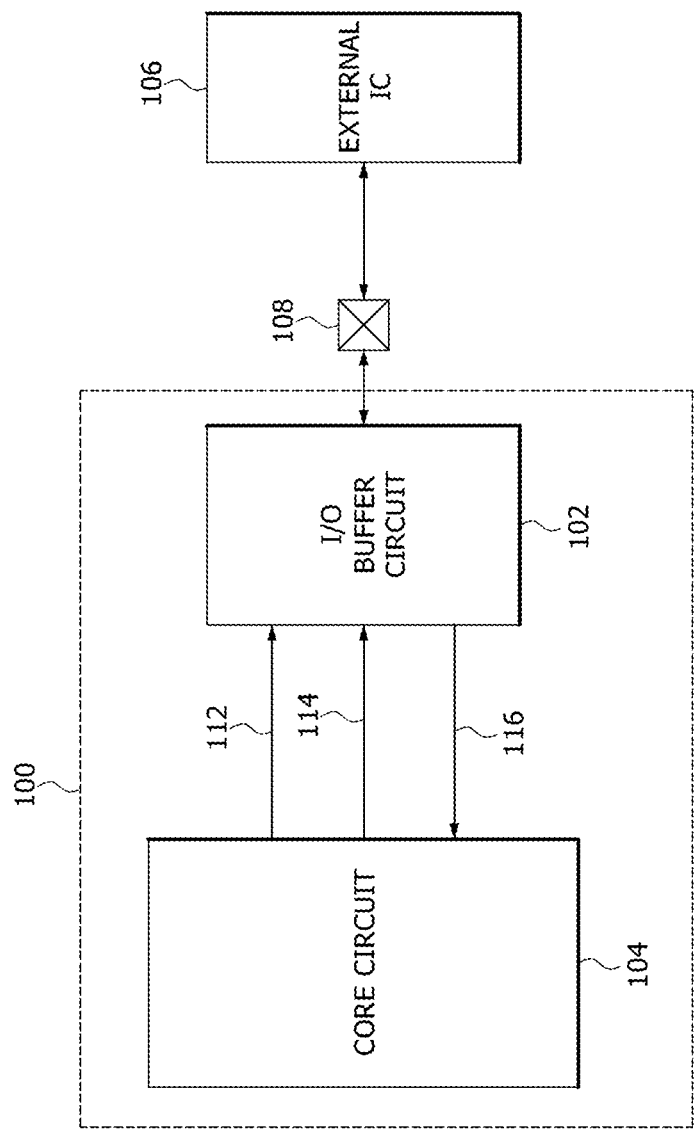
FIG. 1 is a block diagram illustrating an example of an integrated circuit including an input/output (I/O) buffer circuit.

FIG. 1 is a block diagram illustrating an example of an integrated circuit 100 including an input/output (I/O) buffer circuit 102. Referring to FIG. 1, the integrated circuit 100 may include a core circuit 104 and the I/O buffer circuit 102 coupled to the core circuit 104. The I/O buffer circuit 102 may include an input driver and an output driver. The core circuit 104 may have various functions and may perform various operations for exhibiting the various functions. The core circuit 104 may include various circuits, for example, analog circuits and digital circuits to perform the various operations. The core circuit 104 may include transistors, diodes, pre-amplifiers, operational amplifiers (OP amplifiers), buffers, inverters and/or other circuits. The core circuit 104 may further include level-shifters for converting voltage signals within a certain range into voltage signals within another range. The core circuit 104 may further include signal amplification circuits. The core circuit 104 may also include volatile memory cells such as dynamic random access memory (DRAM) cells or nonvolatile memory cells such as NAND-type memory cells or NOR-type memory cells.

The I/O buffer circuit 102 functioning as an output driver may receive an enablement control signal 112 and a data signal 114 from the core circuit 104. The I/O buffer circuit 102 may supply a control signal 116 to the core circuit 104. The I/O buffer circuit 102 may operate to improve electrical characteristics (e.g., a signal integrity and an operation efficiency) of the integrated circuit 100. For example, the I/O buffer circuit 102 may control a slew rate of signals and may control a high load impedance and/or a low load impedance of the core circuit 104 or other circuits. The I/O buffer circuit 102 may be coupled to a pad 108. The pad 108 may connect the integrated circuit 100 to at least one external integrated circuit (IC) 106. The external integrated circuit 106 may perform various operations with the integrated circuit 100 to exhibit various functions. The external integrated circuit 106 may provide a data bus or another type of connection line for coupling a plurality of integrated circuits to each other.

In a present embodiment, the I/O buffer circuit 102 functioning as an output driver may be realized using low voltage devices (e.g., low voltage MOS transistors) for a medium voltage operation such as a 1.8-volt operation. A high voltage such as 3.3 volts in addition to the medium voltage may also be applied to the I/O buffer circuit 102 for interface between the integrated circuit 100 and the external integrated circuit 106. In such a case, while a voltage of the pad 108 changes from a low voltage into a high voltage or vice versa when the I/O buffer circuit 102 operates to output the data signal 114 generated in the core circuit 104 to the pad 108, gate biases of the low voltage devices for a medium voltage operation constituting the I/O buffer circuit 102 may be appropriately amplified according to a level of the pad 108 and a level of the data signal 114 to guarantee the reliability of the low voltage devices for a medium voltage operation.

Figure 2:
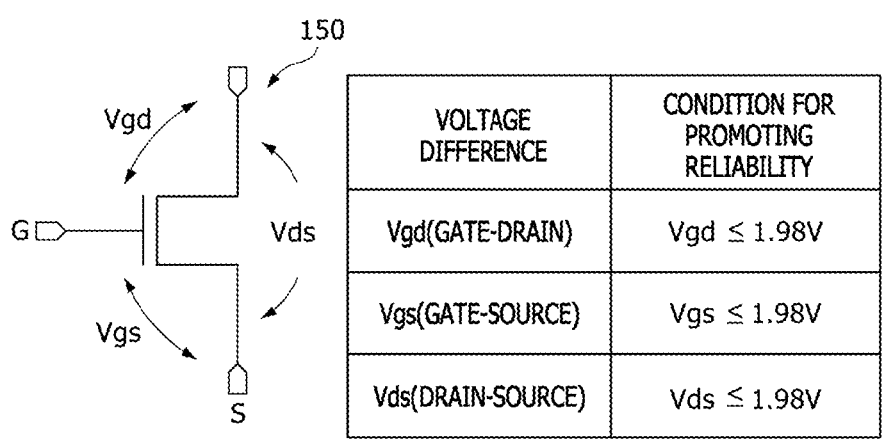
FIG. 2 illustrates a condition for promoting reliability of a low voltage device for a medium voltage operation performed in a high voltage output driver according to an embodiment of the present disclosure.

FIG. 2 illustrates a condition for promoting the reliability of a low voltage device 150 for a medium voltage operation performed in a high voltage output driver according to an embodiment of the present disclosure. Referring to FIG. 2, the low voltage device 150 for a medium voltage operation may be a PMOS transistor or an NMOS transistor. In either case, in order to promote the reliability of the low voltage device 150, a voltage Vgd between a gate and a drain, a voltage Vgs between a gate and a source, and a voltage Vds between a drain and a source have to be equal to or lower than a reliability guarantee voltage. In a present embodiment, the reliability guarantee voltage may be defined as a maximum voltage that is applied between the terminals of the low voltage device 150 without breakdown of a gate oxide layer of the low voltage device 150. In an embodiment, the reliability guarantee voltage of the low voltage device 150 for a medium voltage operation may be set to be 110 percent of the medium voltage. For example, if the medium voltage is 1.8 volts, the reliability guarantee voltage may be set to be 1.98 volts. In such a case, all of the voltage Vgd, the voltage Vgs and the voltage Vds have to be equal to or lower than 1.98 volts. If the voltage Vgd or the voltage Vgs is higher than 1.98 volts, the gate oxide layer of the low voltage device 150 may be damaged or broken due to a strong electric field which is vertically created across the gate oxide layer. If the voltage Vds is higher than 1.98 volts, carriers (e.g., electrons) may be injected into and trapped in the gate oxide layer due to a hot carrier injection (HCI) phenomenon. As a result, the gate oxide layer of the low voltage device 150 may be damaged or broken down.

FIG. 3 is a block diagram illustrating a high voltage output driver 200 according to an embodiment of the present disclosure. Referring to FIG. 3, the high voltage output driver 200 may include a first input terminal 201 receiving a data signal DATA, a second input terminal 202 receiving an enablement control signal EN, an output terminal 203 coupled to a pad 205, a pull-up driver 210 coupled to the output terminal 203, and a pull-down driver 220 coupled to the output terminal 203. The pull-up driver 210 may supply a high voltage VDDH to the pad 205 through the output terminal 203, in response to a first gate control signal PG and a first bias control signal P_bias. The pull-down driver 220 may supply a ground voltage, for example, 0 volts to the pad 205 through the output terminal 203, in response to a second gate control signal NG and a second bias control signal N_bias.

The pull-up driver 210 may include a first main driver 211 and a first bias driver 212 which are coupled in series between a high voltage VDDH terminal and the output terminal 203. The first main driver 211 may be realized using a first PMOS transistor PM1. The first bias driver 212 may be realized using a second PMOS transistor PM2. The second PMOS transistor PM2 may be employed to lower a voltage applied between two terminals (i.e., a source terminal and a drain terminal) of the first PMOS transistor PM1. The first gate control signal PG may be applied to a gate of the first PMOS transistor PM1. The first bias control signal P_bias may be applied to a gate of the second PMOS transistor PM2. A source of the first PMOS transistor PM1 may be coupled to the high voltage VDDH terminal. A drain of first PMOS transistor PM1 may be coupled to a source of the second PMOS transistor PM2 through a node NODE_A. A drain of the second PMOS transistor PM2 may be coupled to the pad 205 through the output terminal 203.

The pull-down driver 220 may include a second main driver 221 and a second bias driver 222 which are coupled in series between a ground voltage terminal and the output terminal 203. The second main driver 221 may be realized using a first NMOS transistor NM1. The second bias driver 222 may be realized using a second NMOS transistor NM2. The second NMOS transistor NM2 may be employed to lower a voltage applied between two terminals (i.e., a drain terminal and a source terminal) of the first NMOS transistor NM1. The second gate control signal NG may be applied to a gate of the first NMOS transistor NM1. The second bias control signal N_bias may be applied to a gate of the second NMOS transistor NM2. A source of the first NMOS transistor NM1 may be coupled to the ground voltage terminal. A drain of first NMOS transistor NM1 may be coupled to a source of the second NMOS transistor NM2 through a node NODE_B. A drain of the second NMOS transistor NM2 may be coupled to the pad 205 through the output terminal 203.

Each of the first PMOS transistor PM1 and the second PMOS transistor PM2 may be realized using the low voltage device 150 for a medium voltage operation, as described with reference to FIG. 2. Thus, in order to promote the reliability of the pull-up driver 210 of the high voltage output driver 200, the voltage Vgd, the voltage Vgs and the voltage Vds of each of the first and second PMOS transistors PM1 and PM2 have to be equal to or lower than the reliability guarantee voltage while the pull-up driver 210 operates.

Each of the first NMOS transistor NM1 and the second NMOS transistor NM2 may be realized using the low voltage device 150 for a medium voltage operation, as described with reference to FIG. 2. Thus, in order to promote the reliability of the pull-down driver 220 of the high voltage output driver 200, the voltage Vgd, the voltage Vgs and the voltage Vds of each of the first and second NMOS transistors NM1 and NM2 have to be equal to or lower than the reliability guarantee voltage while the pull-down driver 220 operates.

When the data signal DATA changes from a low level signal into a high level signal so that a voltage of the pad 205 changes from a low voltage into a high voltage, it may be necessary to prevent a voltage higher than the reliability guarantee voltage from being temporarily applied between terminals of the first and second PMOS transistors PM1 and PM2 before a voltage of the pad 205 completely changes to have a high voltage while a voltage of the pad 205 has a low voltage. When the data signal DATA changes from a high level signal into a low level signal so that a voltage of the pad 205 changes from a high voltage into a low voltage, it may be necessary to prevent a voltage higher than the reliability guarantee voltage from being temporarily applied between terminals of the first and second NMOS transistors NM1 and NM2 before a voltage of the pad 205 completely changes to have a low voltage while a voltage of the pad 205 has a high voltage. The high voltage output driver 200 may temporally lower (i.e., temporally attenuate) the first bias control signal P_bias applied to a gate of the second PMOS transistor PM2 of the pull-up driver 210 while a voltage of the pad 205 changes from a low voltage into a high voltage. In addition, the high voltage output driver 200 may temporarily amplify the second bias control signal N_bias applied to a gate of the second NMOS transistor NM2 of the pull-down driver 220 while a voltage of the pad 205 changes from a high voltage into a low voltage. For the above amplifying and attenuating operations, the high voltage output driver 200 may include a first pad status detection logic circuit 230, a second pad status detection logic circuit 240, a first driver boosting control logic circuit 250 and a second driver boosting control logic circuit 260.

The first pad status detection logic circuit 230 may supply a first pad status detection signal P1 corresponding to a status of the pad 205 to the first driver boosting control logic circuit 250. The second pad status detection logic circuit 240 may supply a second pad status detection signal N1 corresponding to a status of the pad 205 to the second driver boosting control logic circuit 260. The first driver boosting control logic circuit 250 may generate the first bias control signal P_bias that controls the pull-up driver 210 so that voltages between the terminals of the first and second PMOS transistors PM1 and PM2 are equal to or less than the reliability guarantee voltage. The second driver boosting control logic circuit 260 may generate the second bias control signal N_bias that controls the pull-down driver 220 so that voltages between the terminals of the first and second NMOS transistors NM1 and NM2 are equal to or less than the reliability guarantee voltage. Accordingly, the voltages Vgs, Vgd and Vds of the first and second PMOS transistors PM1 and PM2 constituting the pull-up driver 210 and the voltages Vgs, Vgd and Vds of the first and second NMOS transistors NM1 and NM2 constituting the pull-down driver 220 may not be higher than the reliability guarantee voltage. Configurations and operations of the first pad status detection logic circuit 230, the second pad status detection logic circuit 240, the first driver boosting control logic circuit 250 and the second driver boosting control logic circuit 260 will be described later.

The first input terminal 201 may be coupled to an input terminal of a first buffer 271. The first buffer 271 may buffer the data signal DATA that is inputted through the first input terminal 201 and may output the buffered data signal through an output terminal of the first buffer 271. The first buffer 271 may output a low voltage VDDL if the data signal DATA is a high level signal and may output the ground voltage if the data signal DATA is a low level signal. The output terminal of the first buffer 271 may be coupled to an input terminal of a first level shifter (LS1) 281. The first level shifter (LS1) 281 may shift a level of the output signal of the first buffer 271 to generate and output a first level-shifted data signal LS_DATA. If the output signal of the first buffer 271 has the low voltage VDDL, the first level-shifted data signal LS_DATA may have a medium voltage VDDM. If the output signal of the first buffer 271 has the ground voltage, the first level-shifted data signal LS_DATA may also have the ground voltage. The first level-shifted data signal LS_DATA outputted from the first level shifter (LS1) 281 may be used as input signals of a third level shifter (LS3) 283, the first pad status detection logic circuit 230, the first driver boosting control logic circuit 250 and a control logic circuit 290.

The second input terminal 202 may be coupled to an input terminal of a second buffer 272. The second buffer 272 may buffer the enablement control signal EN that is inputted through the second input terminal 202 and may output the buffered enablement control signal through an output terminal of the second buffer 272. The second buffer 272 may output the low voltage VDDL if the enablement control signal EN is a high level signal and may output the ground voltage if the enablement control signal EN is a low level signal. The output terminal of the second buffer 272 may be coupled to an input terminal of a second level shifter (LS2) 282. The second level shifter (LS2) 282 may shift a level of the output signal of the second buffer 272 to generate and output a first level-shifted enablement control signal LS_EN. If the output signal of the second buffer 272 has the low voltage VDDL, the first level-shifted enablement control signal LS_EN may have the medium voltage VDDM. If the output signal of the second buffer 272 has the ground voltage, the first level-shifted enablement control signal LS_EN may also have the ground voltage. The first level-shifted enablement control signal LS_EN outputted from the second level shifter (LS2) 282 may be used as input signals of the first pad status detection logic circuit 230, the first driver boosting control logic circuit 250 and a fourth level shifter (LS4) 284.

The third level shifter (LS3) 283 may be driven by the high voltage VDDH and a first external bias voltage Vbias1. The third level shifter (LS3) 283 may output the first gate control signal PG and a second level-shifted data signal LS_DATAH in response to an inverted signal of the first level-shifted data signal LS_DATA outputted from the first level shifter (LS1) 281. The first external bias voltage Vbias1 may be provided by an external device and may be adjusted by users. The third level shifter (LS3) 283 may perform a level shifting operation in the range from a total voltage of the first external bias voltage Vbias1 and a threshold voltage of a PMOS transistor in the third level shifter (LS3) 283 to the high voltage VDDH. The first gate control signal PG outputted from the third level shifter (LS3) 283 may be a low level signal or a high level signal. The low level signal may have a voltage level (Vbias1+Vtp) corresponding to a sum of the first external bias voltage Vbias1 and a threshold voltage Vtp of the PMOS transistor included in the third level shifter (LS3) 283. The high level signal may have a voltage level of the high voltage VDDH. The second level-shifted data signal LS_DATAH outputted from the third level shifter (LS3) 283 may be a low level signal or a high level signal. In such a case, the low level signal may have a voltage level of the medium voltage VDDM, and the high level signal may have a voltage level of the high voltage VDDH. The second level-shifted data signal LS_DATAH may be used as an input signal of the second pad status detection logic circuit 240.

The fourth level shifter (LS4) 284 may output a second level-shifted enablement control signal LS_ENH in response to the first level-shifted enablement control signal LS_EN (outputted from the second level shifter (LS2) 282) and the first external bias voltage Vbias1. The second level-shifted enablement control signal LS_ENH may be used as an input signal of the second pad status detection logic circuit 240.

The control logic circuit 290 may receive an inverted signal of the first level-shifted data signal LS_DATA outputted from the first level shifter (LS1) 281 to output the second gate control signal NG. The second gate control signal NG may be applied to a gate of the first NMOS transistor NM1. If the first level-shifted data signal LS_DATA has the medium voltage VDDM, the second gate control signal NG may have the ground voltage. If the first level-shifted data signal LS_DATA has the ground voltage, the second gate control signal NG may have the medium voltage VDDM. In some embodiments, the control logic circuit 290 may be realized using an inverter.

The first pad status detection logic circuit 230 may be driven by the medium voltage VDDM corresponding to an operation voltage of the first pad status detection logic circuit 230. The first pad status detection logic circuit 230 may receive a pad signal PADR through a feedback terminal 204 coupled to the output terminal 203. The first pad status detection logic circuit 230 may generate and output the first pad status detection signal P1 in response to the pad signal PADR, the first level-shifted data signal LS_DATA outputted from the first level shifter (LS1) 281, and the first level-shifted enablement control signal LS_EN outputted from the second level shifter (LS2) 282. The first pad status detection signal P1 may be used as an input signal of the first driver boosting control logic circuit 250.

The second pad status detection logic circuit 240 may be driven by the medium voltage VDDM and the high voltage VDDH corresponding to operation voltages of the second pad status detection logic circuit 240. The second pad status detection logic circuit 240 may also receive the pad signal PADR through the feedback terminal 204 coupled to the output terminal 203, like the first pad status detection logic circuit 230. The second pad status detection logic circuit 240 may generate and output the second pad status detection signal N1 in response to the pad signal PADR, the second level-shifted data signal LS_DATAH outputted from the third level shifter (LS3) 283, and the second level-shifted enablement control signal LS_ENH outputted from the fourth level shifter (LS4) 284. The second pad status detection signal N1 may be inputted to the second driver boosting control logic circuit 260.

The first driver boosting control logic circuit 250 may be driven by the medium voltage VDDM corresponding to an operation voltage of the first driver boosting control logic circuit 250. The first driver boosting control logic circuit 250 may generate and output the first bias control signal P_bias in response to the first level-shifted data signal LS_DATA outputted from the first level shifter (LS1) 281, a second external bias voltage Vbias2, the first level-shifted enablement control signal LS_EN outputted from the second level shifter (LS2) 282, and the first pad status detection signal P1 outputted from the first pad status detection logic circuit 230. The first bias control signal P_bias may be applied to a gate of the second PMOS transistor PM2.

The second driver boosting control logic circuit 260 may be driven by the medium voltage VDDM and the high voltage VDDH corresponding to operation voltages of the second driver boosting control logic circuit 260. The second driver boosting control logic circuit 260 may generate and output the second bias control signal N_bias in response to the second pad status detection signal N1 outputted from the second pad status detection logic circuit 240. The second bias control signal N_bias may be applied to a gate of the second NMOS transistor NM2.

If both of the enablement control signal EN and the data signal DATA are high level signals, the first level-shifted data signal LS_DATA outputted from the first level shifter (LS1) 281 may have the medium voltage VDDM. The ground voltage may be inputted to the input terminals of the third level shifter (LS3) 283 and the control logic circuit 290. The third level shifter (LS3) 283 may output the high voltage VDDH as the first gate control signal PG, and the control logic circuit 290 may output the medium voltage VDDM as the second gate control signal NG. While the first PMOS transistor PM1 is turned off by the high voltage VDDH applied to a gate of the first PMOS transistor PM1, the first NMOS transistor NM1 may be turned on by the medium voltage VDDM applied to a gate of the first NMOS transistor NM1.

The first pad status detection logic circuit 230 and the first driver boosting control logic circuit 250 may generate the first bias control signal P_bias according to a status of the pad 205. The second pad status detection logic circuit 240 and the second driver boosting control logic circuit 260 may generate the second bias control signal N_bias according to a status of the pad 205. The second PMOS transistor PM2 and the second NMOS transistor NM2 may be turned on by the first bias control signal P_bias applied to a gate of the second PMOS transistor PM2 and the second bias control signal N_bias applied to a gate of the second NMOS transistor NM2, respectively. Accordingly, since the first PMOS transistor PM1 is turned off and both of the first and second NMOS transistors NM1 and NM2 are turned on, the ground voltage may be outputted through the pad 205.

If the enablement control signal EN is a high level signal and the data signal DATA is a low level signal, the first level-shifted data signal LS_DATA outputted from the first level shifter (LS1) 281 may have the ground voltage. The medium voltage VDDM may be inputted to the input terminals of the third level shifter (LS3) 283 and the control logic circuit 290. The third level shifter (LS3) 283 may output the first external bias voltage Vbias1 as the first gate control signal PG, and the control logic circuit 290 may output the ground voltage as the second gate control signal NG. While the first PMOS transistor PM1 is turned on by the first external bias voltage Vbias1 applied to a gate of the first PMOS transistor PM1, the first NMOS transistor NM1 may be turned off by the ground voltage applied to a gate of the first NMOS transistor NM1.

The first pad status detection logic circuit 230 and the first driver boosting control logic circuit 250 may generate the first bias control signal P_bias according to a status of the pad 205. The second pad status detection logic circuit 240 and the second driver boosting control logic circuit 260 may generate the second bias control signal N_bias according to a status of the pad 205. The second PMOS transistor PM2 and the second NMOS transistor NM2 may be turned on by the first bias control signal P_bias applied to a gate of the second PMOS transistor PM2 and the second bias control signal N_bias applied to a gate of the second NMOS transistor NM2, respectively. Accordingly, since the first NMOS transistor NM1 is turned off and both of the first and second PMOS transistors PM1 and PM2 are turned on, the high voltage VDDH may be outputted through the pad 205.

Figure 4:
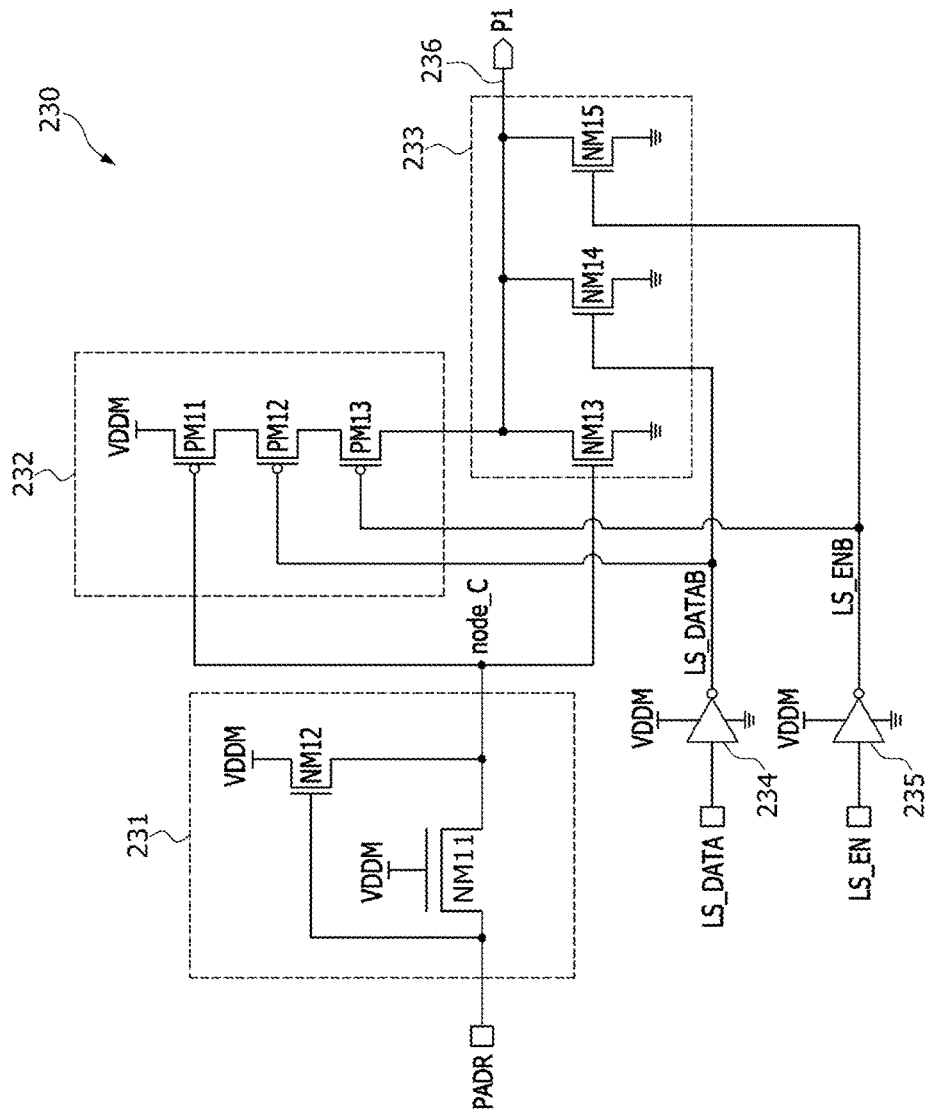
FIG. 4 is a circuit diagram illustrating an example of a first pad status detection logic circuit included in the high voltage output driver of FIG. 3.

FIG. 4 is a circuit diagram illustrating an example of the first pad status detection logic circuit 230 included in the high voltage output driver 200 of FIG. 3. Referring to FIGS. 3 and 4, the first pad status detection logic circuit 230 may be configured to include a node bias setting unit 231, a first switching unit 232 for outputting the medium voltage VDDM, a second switching unit 233 for outputting the ground voltage, a first inverter 234, and a second inverter 235. The pad signal PADR among the input signals of the first pad status detection logic circuit 230 may also be inputted to the node bias setting unit 231. The first level-shifted data signal LS_DATA outputted from the first level shifter (LS1) 281 may be inputted to the first inverter 234, and the first level-shifted enablement control signal LS_EN outputted from the second level shifter (LS2) 282 may be inputted to the second inverter 235. The first pad status detection signal P1 may be outputted through an output terminal 236 of the first pad status detection logic circuit 230.

The node bias setting unit 231 may be configured to include a first NMOS transistor NM11 and a second NMOS transistor NM12. The medium voltage VDDM may be applied to a gate of the first NMOS transistor NM11. The pad signal PADR may be applied to a drain of the first NMOS transistor NM11. A source of the first NMOS transistor NM11 may be coupled to a node NODE_C. A gate of the second NMOS transistor NM12 may be coupled to a drain of the first NMOS transistor NM11. The medium voltage VDDM may be applied to a drain of the second NMOS transistor NM12. A source of the second NMOS transistor NM12 may be coupled to the node NODE_C.

The pad signal PADR may have a voltage level that varies from the ground voltage to the high voltage VDDH. If the pad signal PADR has the ground voltage, the first NMOS transistor NM11 may be turned on and the second NMOS transistor NM12 may be turned off. Thus, the node NODE_C may have the ground voltage which is substantially the same voltage level as the pad signal PADR. If the pad signal PADR has the high voltage VDDH, the first NMOS transistor NM11 may be turned off and the second NMOS transistor NM12 may be turned on. Thus, the node NODE_C may have the medium voltage VDDM.

The first switching unit 232 for supplying the medium voltage VDDM may be configured to include a first PMOS transistor PM11, a second PMOS transistor PM12 and a third PMOS transistor PM13 which are coupled in series between the medium voltage VDDM terminal and the output terminal 236. A gate of the first PMOS transistor PM11 may be coupled to the node NODE_C. A source of the first PMOS transistor PM11 may be coupled to the medium voltage VDDM terminal. A drain of the first PMOS transistor PM11 may be coupled to a source of the second PMOS transistor PM12. A gate of the second PMOS transistor PM12 may be coupled to an output terminal of the first inverter 234. A drain of the second PMOS transistor PM12 may be coupled to a source of the third PMOS transistor PM13. A gate of the third PMOS transistor PM13 may be coupled to an output terminal of the second inverter 235. A drain of the third PMOS transistor PM13 may be coupled to the output terminal 236.

If all of the first to third PMOS transistors PM11, PM12 and PM13 are turned on, the medium voltage VDDM may be outputted as the first pad status detection signal P1 through the output terminal 236. In order that the medium voltage VDDM is outputted as the first pad status detection signal P1 through the output terminal 236, the node NODE_C, the output signal of the first inverter 234, and the output signal of the second inverter 235 all should have the ground voltage.

The second switching unit 233 for supplying the ground voltage may be configured to include a third NMOS transistor NM13, a fourth NMOS transistor NM14 and a fifth NMOS transistor NM15 which are coupled in parallel between the output terminal 236 and the ground voltage terminal. A gate of the third NMOS transistor NM13 may be coupled to the node NODE_C. A gate of the fourth NMOS transistor NM14 may be coupled to the output terminal of the first inverter 234. A gate of the fifth NMOS transistor NM15 may be coupled to the output terminal of the second inverter 235. All of drains of the third to fifth NMOS transistors NM13, NM14 and NM15 may be coupled to the output terminal 236. All of sources of the third to fifth NMOS transistors NM13, NM14 and NM15 may be coupled to the ground voltage terminal. If at least one of the third to fifth NMOS transistors NM13, NM14 and NM15 is turned on, the ground voltage may be outputted as the first pad status detection signal P1 through the output terminal 236.

The first inverter 234 may generate an output signal LS_DATAB in response to the first level-shifted data signal LS_DATA outputted from the first level shifter (LS1) 281. If the first level-shifted data signal LS_DATA is a high level signal having the medium voltage VDDM, the output signal LS_DATAB may be a low level signal having the ground voltage. If the first level-shifted data signal LS_DATA is a low level signal having the ground voltage, the output signal LS_DATAB may be a high level signal having the medium voltage VDDM. The output signal LS_DATAB may be applied to gates of the second PMOS transistor PM12 and the fourth NMOS transistor NM14. Thus, any one of the second PMOS transistor PM12 and the fourth NMOS transistor NM14 may be electively turned on.

The second inverter 235 may generate an output signal LS_ENB in response to the first level-shifted enablement control signal LS_EN outputted from the second level shifter (LS2) 282. If the first level-shifted enablement control signal LS_EN is a high level signal having the medium voltage VDDM, the output signal LS_ENB may be a low level signal having the ground voltage. On the contrary, if the first level-shifted enablement control signal LS_EN is a low level signal having the ground voltage, the output signal LS_ENB may be a high level signal having the medium voltage VDDM. The output signal LS_ENB may be applied to gates of the third PMOS transistor PM13 and the fifth NMOS transistor NM15. Thus, any one of the third PMOS transistor PM13 and the fifth NMOS transistor NM15 may be electively turned on.

Figure 5:
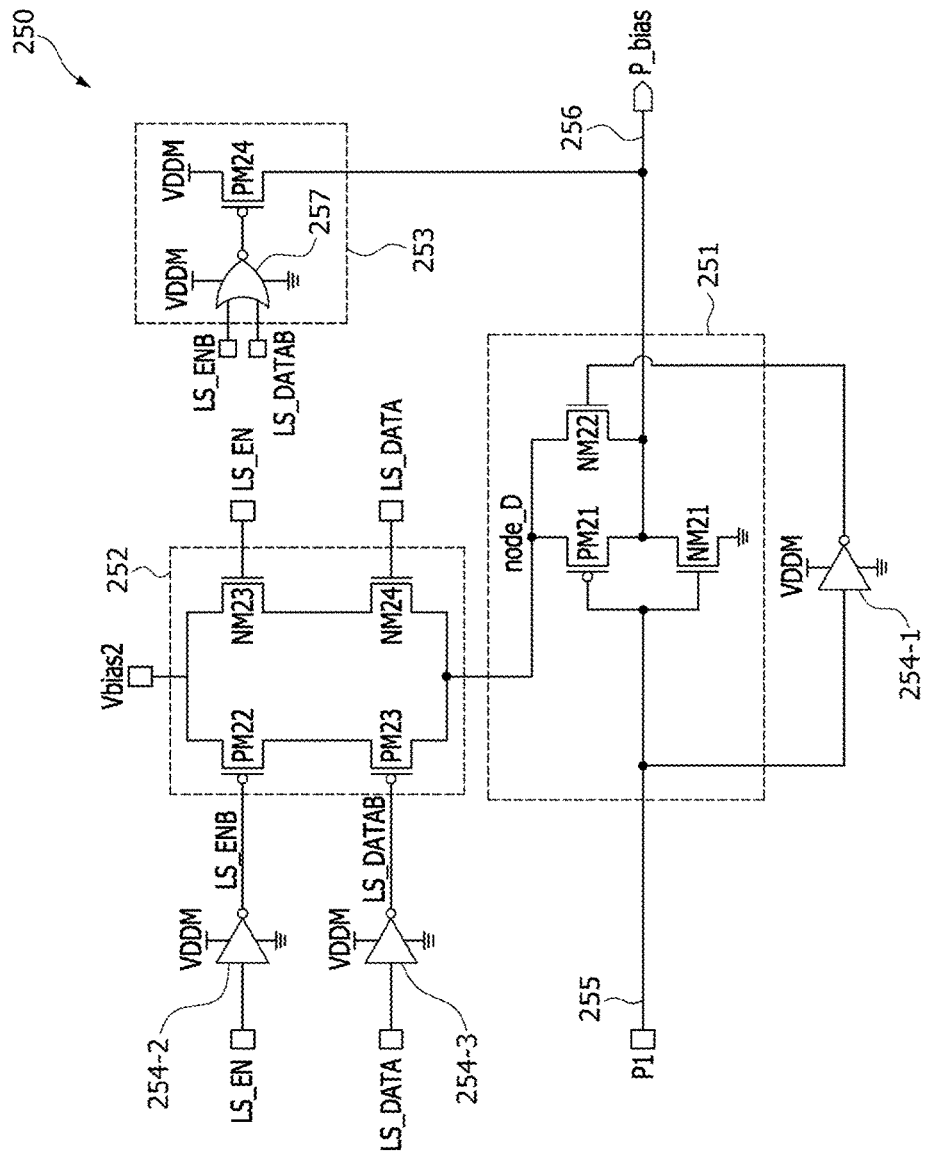
FIG. 5 is a circuit diagram illustrating an example of a first driver boosting control logic circuit included in the high voltage output driver of FIG. 3.

FIG. 5 is a circuit diagram illustrating an example of the first driver boosting control logic circuit 250 included in the high voltage output driver 200 of FIG. 3. Referring to FIGS. 3 and 5, the first driver boosting control logic circuit 250 may output the first bias control signal P_bias in response to the first pad status detection signal P1, the first level-shifted enablement control signal LS_EN, and the first level-shifted data signal LS_DATA. In order to realize the above function of the first driver boosting control logic circuit 250, the first driver boosting control logic circuit 250 may be configured to include a ground voltage supply unit 251, a second external bias voltage (Vbias2) supply unit 252, a medium voltage (VDDM) supply unit 253 and first to third inverters 254-1, 254-2 and 254-3.

The ground voltage supply unit 251 may be configured to include a first PMOS transistor PM21, a first NMOS transistor NM21 and a second NMOS transistor NM22. The first PMOS transistor PM21 and the first NMOS transistor NM21 may be coupled in series between a node NODE_D and the ground voltage terminal. Gates of the first PMOS transistor PM21 and the first NMOS transistor NM21 may be coupled to an input terminal 255 that receives the first pad status detection signal P1. A source of the first PMOS transistor PM21 may be coupled to the node NODE_D, and a drain of the first PMOS transistor PM21 may be coupled to an output terminal 256 of the first driver boosting control logic circuit 250. A drain of the first NMOS transistor NM21 may be coupled to the output terminal 256, and a source of the first NMOS transistor NM21 may be coupled to the ground voltage terminal. The second NMOS transistor NM22 and the first PMOS transistor PM21 may be coupled in parallel between the node NODE_D and the output terminal 256. A gate of the second NMOS transistor NM22 may be coupled to an output terminal of the first inverter 254-1. A drain of the second NMOS transistor NM22 may be coupled to the node NODE_D, and a source of the second NMOS transistor NM22 may be coupled to the output terminal 256. An input terminal of the first inverter 254-1 may be coupled to the input terminal 255 that receives the first pad status detection signal P1. The first inverter 254-1 may generate and output the medium voltage VDDM or the ground voltage in response to the first pad status detection signal P1.

The second external bias voltage (Vbias2) supply unit 252 may be configured to include a second PMOS transistor PM22 and a third PMOS transistor PM23 coupled in series between the second external bias voltage (Vbias2) terminal and the node NODE_D as well as a third NMOS transistor NM23 and a fourth NMOS transistor NM24 coupled in series between the second external bias voltage (Vbias2) terminal and the node NODE_D. The second PMOS transistor PM22 and the third NMOS transistor NM23 may be coupled in parallel to the second external bias voltage (Vbias2) terminal, and the third PMOS transistor PM23 and the fourth NMOS transistor NM24 may be coupled in parallel to the node NODE_D. The second external bias voltage Vbias2 may be supplied to a source of the second PMOS transistor PM22 and a drain of the third NMOS transistor NM23. The second external bias voltage Vbias2 may be provided by an external device and may be adjusted by users. In some embodiments, the second external bias voltage Vbias2 may be equal to the first external bias voltage Vbias1. A drain of the third PMOS transistor PM23 and a source of the fourth NMOS transistor NM24 may be coupled to the node NODE_D. A drain of the second PMOS transistor PM22 may be coupled to a source of the third PMOS transistor PM23. A source of the third NMOS transistor NM23 may be coupled to a drain of the fourth NMOS transistor NM24.

A gate of the second PMOS transistor PM22 may be coupled to an output terminal of the second inverter 254-2. The first level-shifted enablement control signal LS_EN may be applied to an input terminal of the second inverter 254-2. The second inverter 254-2 may output the medium voltage VDDM or the ground voltage as the output signal LS_ENB in response to the first level-shifted enablement control signal LS_EN. A gate of the third PMOS transistor PM23 may be coupled to an output terminal of the third inverter 254-3. The first level-shifted data signal LS_DATA may be applied to an input terminal of the third inverter 254-3. The third inverter 254-3 may output the medium voltage VDDM or the ground voltage as the output signal LS_DATAB in response to the first level-shifted data signal LS_DATA. The first level-shifted enablement control signal LS_EN may be applied to a gate of the third NMOS transistor NM23. The first level-shifted data signal LS_DATA may be applied to a gate of the fourth NMOS transistor NM24.

The medium voltage (VDDM) supply unit 253 may be configured to include a fourth PMOS transistor PM24 and a logic gate, for example but not limited to, a NOR gate 257. A source of the fourth PMOS transistor PM24 may be coupled to the medium voltage VDDM terminal, and a drain of the fourth PMOS transistor PM24 may be coupled to the output terminal 256. A gate of the fourth PMOS transistor PM24 may be coupled to an output terminal of the NOR gate 257. The output signal LS_ENB of the second inverter 254-2 and the output signal LS_DATAB of the third inverter 254-3 may be applied to input terminals of the NOR gate 257. The NOR gate 257 may output the medium voltage VDDM if both of the output signal LS_ENB of the second inverter 254-2 and the output signal LS_DATAB of the third inverter 254-3 have a low level, and the NOR gate 257 may output the ground voltage if at least one of the output signal LS_ENB of the second inverter 254-2 and the output signal LS_DATAB of the third inverter 254-3 has a high level.

Figure 6:
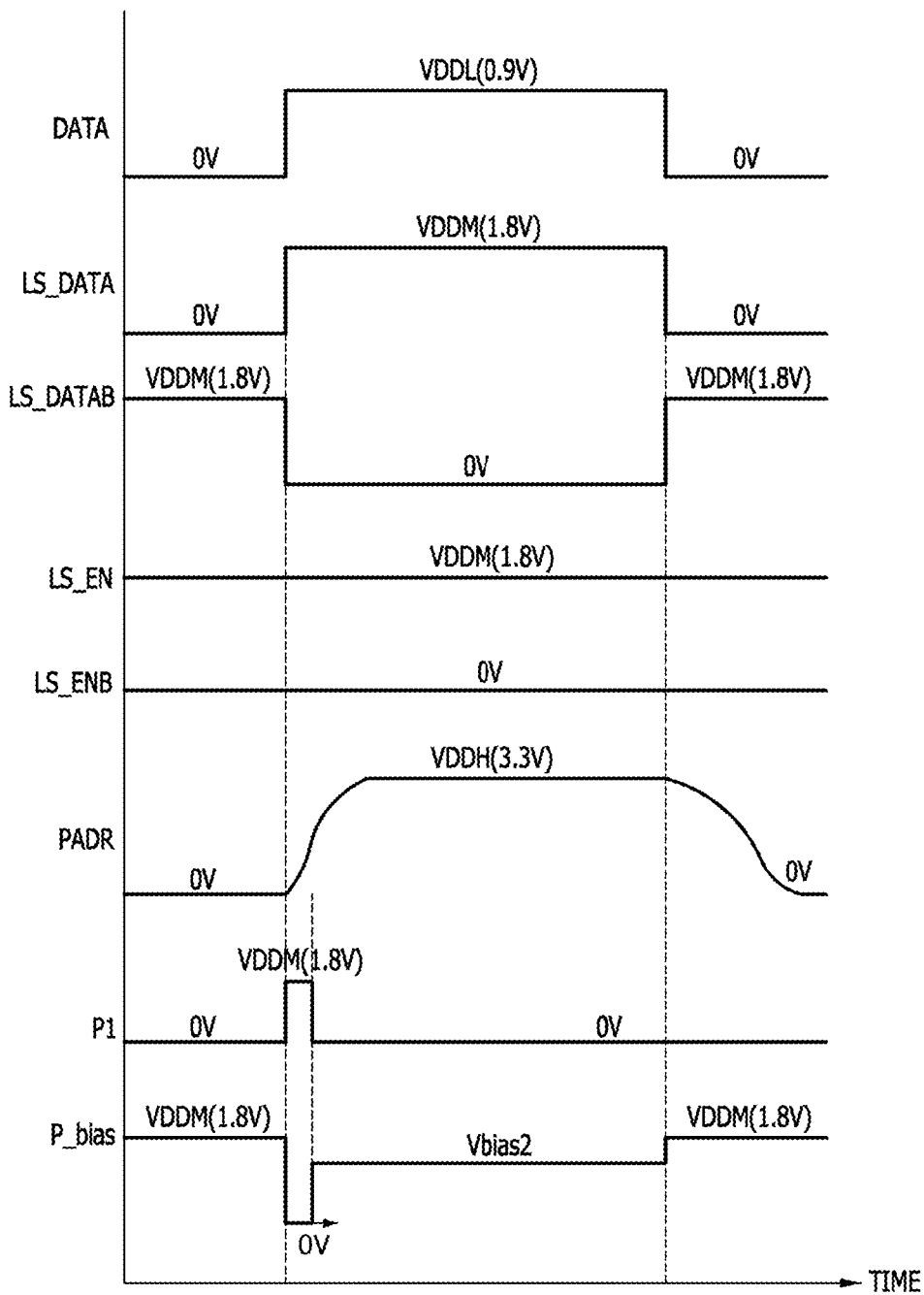
FIG. 6 is a timing diagram illustrating an operation of the first pad status detection logic circuit illustrated in FIG. 4 and an operation of the first driver boosting control logic circuit illustrated in FIG. 5.

FIG. 6 is a timing diagram illustrating an operation of the first pad status detection logic circuit 230 illustrated in FIG. 4 and an operation of the first driver boosting control logic circuit 250 illustrated in FIG. 5. The operations of the first pad status detection logic circuit 230 and the first driver boosting control logic circuit 250 will be described in conjunction with an example in which the low voltage VDDL, the medium voltage VDDM and the high voltage VDDH are 0.9 volts, 1.8 volts and 3.3 volts, respectively. Referring to FIGS. 3, 4, 5 and 6, if the data signal DATA is a low level signal having the ground voltage, the first level-shifted data signal LS_DATA outputted from the first level shifter (LS1) 281 may have the ground voltage. Thus, the output signals LS_DATAB of the first inverter 234 in the first pad status detection logic circuit 230 and the third inverter 254-3 in the first driver boosting control logic circuit 250 may have the medium voltage VDDM of 1.8 volts. The enablement control signal EN corresponding to a high level signal may be inputted to the high voltage output driver 200 for an operation of the high voltage output driver 200. Thus, the first level-shifted enablement control signal LS_EN outputted from the second level shifter (LS2) 282 may have the medium voltage VDDM of 1.8 volts. As a result, the output signals LS_ENB of the second inverter 235 in the first pad status detection logic circuit 230 and the second inverter 254-2 in the first driver boosting control logic circuit 250 may have the ground voltage.

Since the data signal DATA is a low level signal, the ground voltage may be applied to the pad 205 of the high voltage output driver 200 and the pad signal PADR may have the ground voltage. A voltage of the node NODE_C in the first pad status detection logic circuit 230 of FIG. 4 may be the ground voltage because the pad signal PADR has the ground voltage. Accordingly, while the first PMOS transistor PM11 of the first switching unit 232 for supplying the medium voltage VDDM used in the first pad status detection logic circuit 230 is turned on, the third NMOS transistor NM13 of the second switching unit 233 for supplying the ground voltage may be turned off. Since the output signal LS_DATAB of the first inverter 234 in the first pad status detection logic circuit 230 has the medium voltage VDDM of 1.8 volts, the second PMOS transistor PM12 of the first switching unit 232 for supplying the medium voltage VDDM may be turned off while the fourth NMOS transistor NM14 of the second switching unit 233 for supplying the ground voltage is turned on. Because the output signal LS_ENB of the second inverter 235 in the first pad status detection logic circuit 230 has the ground voltage, the third PMOS transistor PM13 of the first switching unit 232 for supplying the medium voltage VDDM may be turned on while the fifth NMOS transistor NM15 of the second switching unit 233 for supplying the ground voltage is turned off. As such, since the second PMOS transistor PM12 of the first switching unit 232 for supplying the medium voltage VDDM is turned off and the fourth NMOS transistor NM14 of the second switching unit 233 for supplying the ground voltage is turned on, the ground voltage of 0 volts may be outputted as the first pad status detection signal P1.

If the first pad status detection signal P1 has the ground voltage, the first inverter 254-1 in the first driver boosting control logic circuit 250 of FIG. 5 may output the medium voltage VDDM of 1.8 volts. The first PMOS transistor PM21 and the first NMOS transistor NM21 of the ground voltage supply unit 251 may be turned on and turned off, respectively. Thus, the output terminal 256 may be electrically coupled to the node NODE_D. However, the medium voltage VDDM of 1.8 volts may be applied to the gate of the third PMOS transistor PM23 in the second external bias voltage (Vbias2) supply unit 252, and the ground voltage of 0 volts may be applied to the gate of the fourth NMOS transistor NM24 in the second external bias voltage (Vbias2) supply unit 252. Thus, both of the third PMOS transistor PM23 and the fourth NMOS transistor NM24 may be turned off.

The output signal LS_ENB (having the ground voltage of 0 volts) of the second inverter 254-2 in the first driver boosting control logic circuit 250 and the output signal LS_DATAB (having the medium voltage VDDM of 1.8 volts) of the third inverter 254-3 in the first driver boosting control logic circuit 250 may be applied to the input terminals of the NOR gate 257 in the medium voltage (VDDM) supply unit 253, respectively. Thus, the NOR gate 257 may output the ground voltage of 0 volts through the output terminal of the NOR gate 257. The ground voltage of 0 volts may be applied to the gate of the fourth PMOS transistor PM24 to turn on the fourth PMOS transistor PM24. Thus, the medium voltage VDDM of 1.8 volts may be outputted as the first bias control signal P_bias through the output terminal 256 of the first driver boosting control logic circuit 250.

As described above, while the enablement control signal EN is a high level signal with the data signal DATA of a low level signal and the pad 205 having the ground voltage, the first gate control signal PG of 3.3 volts corresponding to the high voltage VDDH may be applied to the gate of the first PMOS transistor PM1 in the pull-up driver 210 and the first bias control signal P_bias of 1.8 volts corresponding to the medium voltage VDDM may be applied to the gate of the second PMOS transistor PM2 in the pull-up driver 210. Thus, the pull-up driver 210 may be inactivated while the data signal DATA is a low level signal.

If the data signal DATA changes from a low level signal into a high level signal, the first level-shifted data signal LS_DATA outputted from the first level shifter (LS1) 281 may have the medium voltage VDDM of 1.8 volts. Thus, the output signals LS_DATAB of the first inverter 234 in the first pad status detection logic circuit 230 and the third inverter 254-3 in the first driver boosting control logic circuit 250 may have the ground voltage of 0 volts. Accordingly, the second PMOS transistor PM12 of the first switching unit 232 for supplying the medium voltage VDDM may be turned on, and the fourth NMOS transistor NM14 of the second switching unit 233 for supplying the ground voltage may be turned off. Both of the third PMOS transistor PM23 and the fourth NMOS transistor NM24 in the second external bias voltage (Vbias2) supply unit 252 of the first driver boosting control logic circuit 250 may be turned on, and the ground voltage of 0 volts may be applied to one of the input terminals of the NOR gate 257 in the medium voltage (VDDM) supply unit 253.

The enablement control signal EN may maintain a high level signal for an operation of the high voltage output driver 200. Thus, the first level-shifted enablement control signal LS_EN outputted from the second level shifter (LS2) 282 may maintain the medium voltage VDDM of 1.8 volts. As a result, the output signals LS_ENB of the second inverter 235 in the first pad status detection logic circuit 230 and the second inverter 254-2 in the first driver boosting control logic circuit 250 may maintain the ground voltage of 0 volts. Accordingly, the third PMOS transistor PM13 of the first switching unit 232 for supplying the medium voltage VDDM may be turned on, and the fifth NMOS transistor NM15 of the second switching unit 233 for supplying the ground voltage may be turned off. Both of the second PMOS transistor PM22 and the third NMOS transistor NM23 in the second external bias voltage (Vbias2) supply unit 252 of the first driver boosting control logic circuit 250 may be turned on, and the ground voltage of 0 volts may be applied to the other of the input terminals of the NOR gate 257 in the medium voltage (VDDM) supply unit 253.

As the data signal DATA changes from a low level signal into a high level signal, the pad signal PADR may be initiated to change from the ground voltage of 0 volts into the high voltage VDDH of 3.3 volts. While the pad signal PADR is changing, a level of the pad signal PADR may increase from 0 volts to reach 3.3 volts whereas the data signal DATA maintains a high level signal. While the pad signal PADR has a voltage level between the ground voltage of 0 volts and the medium voltage VDDM of 1.8 volts, the node NODE_C in the first pad status detection logic circuit 230 of FIG. 4 may also have a voltage level between 0 volts and 1.8 volts. In such a case, the first PMOS transistor PM11 of the first switching unit 232 for supplying the medium voltage VDDM may still be turned on, and the third NMOS transistor NM13 of the second switching unit 233 for supplying the ground voltage may still be turned off. Since all of the first to third PMOS transistors PM11, PM12 and PM13 of the first switching unit 232 for supplying the medium voltage VDDM are turned on and all of the third to fifth NMOS transistors NM13, NM14 and NM15 of the second switching unit 233 for supplying the ground voltage are turned off, the medium voltage VDDM of 1.8 volts may be outputted as the first pad status detection signal P1 corresponding to the output signal of the first pad status detection logic circuit 230.

If a voltage of the first pad status detection signal P1 changes from the ground voltage of 0 volts into the medium voltage VDDM of 1.8 volts, the first inverter 254-1 in the first driver boosting control logic circuit 250 of FIG. 5 may output the ground voltage of 0 volts to turn off the second NMOS transistor NM22 in the ground voltage supply unit 251. In such a case, the first pad status detection signal P1 having the medium voltage VDDM of 1.8 volts may be applied to the gates of the first PMOS transistor PM21 and the first NMOS transistor NM21 to turn off the first PMOS transistor PM21 and to turn on the first NMOS transistor NM21. Thus, the ground voltage of 0 volts may be outputted as the first bias control signal P_bias through the output terminal 256 of the first driver boosting control logic circuit 250.

The output signal LS_ENB (having the ground voltage of 0 volts) of the second inverter 254-2 in the first driver boosting control logic circuit 250 and the output signal LS_DATAB (having the ground voltage of 0 volts) of the third inverter 254-3 in the first driver boosting control logic circuit 250 may be applied to the input terminals of the NOR gate 257 in the medium voltage (VDDM) supply unit 253, respectively. Thus, the NOR gate 257 may output the medium voltage VDDM of 1.8 volts through the output terminal of the NOR gate 257. The medium voltage VDDM of 1.8 volts may be applied to the gate of the fourth PMOS transistor PM24 to turn off the fourth PMOS transistor PM24. This status may be maintained while the data signal DATA is a high level signal.

While the pad signal PADR has a voltage level between the medium voltage VDDM of 1.8 volts and the high voltage of 3.3 volts, the first NMOS transistor NM11 and the second NMOS transistor NM12 in the node bias setting unit 231 of the first pad status detection logic circuit 230 of FIG. 4 may be respectively turned off and turned on. As a result, the node NODE_C in the first pad status detection logic circuit 230 of FIG. 4 may have the medium voltage VDDM of 1.8 volts. Thus, the first PMOS transistor PM11 of the first switching unit 232 for supplying the medium voltage VDDM may still be turned off, and the third NMOS transistor NM13 of the second switching unit 233 for supplying the ground voltage may still be turned on. Accordingly, the first pad status detection signal P1 corresponding to the output signal of the first pad status detection logic circuit 230 may return to the ground voltage level again.

If the first pad status detection signal P1 returns to the ground voltage level again, the first PMOS transistor PM21 of the ground voltage supply unit 251 of the first driver boosting control logic circuit 250 may be turned on and the first NMOS transistor NM21 of the ground voltage supply unit 251 of the first driver boosting control logic circuit 250 may be turned off. The fourth PMOS transistor PM24 of the medium voltage (VDDM) supply unit 253 may still be turned off. Thus, since the output terminal 256 of the first driver boosting control logic circuit 250 is electrically coupled to the node NODE_D, the first bias control signal P_bias may have substantially the same voltage as the node NODE_D.

Both of the first level-shifted data signal LS_DATA and the first level-shifted enablement control signal LS_EN, which are inputted to the first driver boosting control logic circuit 250, may have the medium voltage VDDM of 1.8 volts, and both of the output signal LS_ENB of the second inverter 254-2 and the output signal LS_DATAB of the third inverter 254-3 may have the ground voltage of 0 volts. Thus, since all of the second and third PMOS transistors PM22 and PM23 and the third and fourth NMOS transistors NM23 and NM24 may be turned on, the second external bias voltage Vbias2 may be applied to the node NODE_D. The second external bias voltage Vbias2 may be outputted as the first bias control signal P_bias through the output terminal 256. This status may be maintained while the pad signal PADR has the high voltage VDDH of 3.3 volts.

As described above, if the first level-shifted enablement control signal LS_EN is a high level signal and the data signal DATA changes from a low level signal into a high level signal, the pull-up driver 210 may be activated. Thus, the pad signal PADR may be initiated to change from the ground voltage of 0 volts into the high voltage of 3.3 volts, and the pad signal PADR may maintain the high voltage of 3.3 volts after the pad signal PADR is changed. While the pad signal PADR is changing to have the high voltage of 3.3 volts and the pad signal PADR maintains the high voltage of 3.3 volts after the pad signal PADR is changed, the first gate control signal PG having the first external bias voltage Vbias1 of 1.32 volts may be applied to the gate of the first PMOS transistor PM1 in the pull-up driver 210. In contrast, a level of the first bias control signal P_bias applied to the gate of the second PMOS transistor PM2 in the pull-up driver 210 while the pad signal PADR is changing may be amplified from the ground voltage to reach the second external bias voltage Vbias2 of 1.32 volts if the pad signal PADR is higher than a certain voltage, for example, the medium voltage VDDM of 1.8 volts. While the data signal DATA maintains a high level signal, the second external bias voltage Vbias2 of 1.32 volts may be continuously applied to the gate of the second PMOS transistor PM2 in the pull-up driver 210.

If the data signal DATA changes from a high level signal into a low level signal, the first level-shifted data signal LS_DATA outputted from the first level shifter (LS1) 281 may also return to the ground voltage of 0 volts. Thus, the output signals LS_DATAB of the first inverter 234 in the first pad status detection logic circuit 230 and the third inverter 254-3 in the first driver boosting control logic circuit 250 may have the medium voltage VDDM of 1.8 volts. Accordingly, the second PMOS transistor PM12 of the first switching unit 232 for supplying the medium voltage VDDM may be turned off, and the fourth NMOS transistor NM14 of the second switching unit 233 for supplying the ground voltage may be turned on. Both of the third PMOS transistor PM23 and the fourth NMOS transistor NM24 in the second external bias voltage (Vbias2) supply unit 252 of the first driver boosting control logic circuit 250 may be turned off, and the medium voltage VDDM of 1.8 volts may be applied to one of the input terminals of the NOR gate 257 in the medium voltage (VDDM) supply unit 253.

The enablement control signal EN may maintain a high level signal for an operation of the high voltage output driver 200. Thus, the first level-shifted enablement control signal LS_EN outputted from the second level shifter (LS2) 282 may maintain the medium voltage VDDM of 1.8 volts. As a result, the output signals LS_ENB of the second inverter 235 in the first pad status detection logic circuit 230 and the second inverter 254-2 in the first driver boosting control logic circuit 250 may maintain the ground voltage of 0 volts. Accordingly, the third PMOS transistor PM13 of the first switching unit 232 for supplying the medium voltage VDDM may still be turned on, and the fifth NMOS transistor NM15 of the second switching unit 233 for supplying the ground voltage may still be turned off. Both of the second PMOS transistor PM22 and the third NMOS transistor NM23 in the second external bias voltage (Vbias2) supply unit 252 of the first driver boosting control logic circuit 250 may be turned on, and the ground voltage of 0 volts may be applied to the other of the input terminals of the NOR gate 257 in the medium voltage (VDDM) supply unit 253.

As the data signal DATA changes from a high level signal into a low level signal, the pad signal PADR may be initiated to change from the high voltage VDDH of 3.3 volts into the ground voltage of 0 volts. While the pad signal PADR is changed, a level of the pad signal PADR may be lowered from 3.3 volts to reach 0 volts whereas the data signal DATA maintains a low level signal. While the pad signal PADR has a voltage level between the high voltage VDDH of 3.3 volts and the medium voltage VDDM of 1.8 volts, the node NODE_C in the first pad status detection logic circuit 230 of FIG. 4 may maintain the medium voltage VDDM of 1.8 volts. In such a case, the first PMOS transistor PM11 of the first switching unit 232 for supplying the medium voltage VDDM may be turned off, and the third NMOS transistor NM13 of the second switching unit 233 for supplying the ground voltage may be turned on. Since the first and second PMOS transistors PM11 and PM12 of the first switching unit 232 for supplying the medium voltage VDDM are turned off and the third and fourth NMOS transistors NM13 and NM14 of the second switching unit 233 for supplying the ground voltage are turned on, the first pad status detection signal P1 may maintain the ground voltage of 0 volts.

As the first level-shifted data signal LS_DATA changes into the ground voltage of 0 volts and the output signal LS_DATAB of the third inverter 254-3 changes into the medium voltage of 1.8 volts with the first pad status detection signal P1 maintaining the ground voltage, the node NODE_D in the first driver boosting control logic circuit 250 may be electrically disconnected from the second external bias voltage (Vbias2) terminal. Instead, the ground voltage of 0 volts and the medium voltage of 1.8 volts may be applied to the input terminals of the NOR gate 257 in the medium voltage (VDDM) supply unit 253. As a result, the NOR gate 257 may output the ground voltage of 0 volts through the output terminal of the NOR gate 257. The ground voltage corresponding to the output signal of the NOR gate 257 may be applied to the gate of the fourth PMOS transistor PM24 to turn on the fourth PMOS transistor PM24. Thus, the medium voltage of 1.8 volts may be outputted as the first bias control signal P_bias through the output terminal 256 of the first driver boosting control logic circuit 250.

While the pad signal PADR has a voltage level between the medium voltage VDDM of 1.8 volts and the ground voltage of 0 volts, the first NMOS transistor NM11 and the second NMOS transistor NM12 in the node bias setting unit 231 of the first pad status detection logic circuit 230 of FIG. 4 may be respectively turned on and turned off. As a result, the node NODE_C may have substantially the same voltage level as the pad signal PADR. Thus, the first PMOS transistor PM11 of the first switching unit 232 for supplying the medium voltage VDDM may be turned on, and the third NMOS transistor NM13 of the second switching unit 233 for supplying the ground voltage may be turned off. Even though the first PMOS transistor PM11 is turned on and the third NMOS transistor NM13 is turned off, the second PMOS transistor PM12 may be turned off and the fourth NMOS transistor NM14 may be turned on. Accordingly, the first pad status detection signal P1 may maintain the ground voltage of 0 volts and the first bias control signal P_bias may have the medium voltage VDDM of 1.8 volts.

Figure 7:
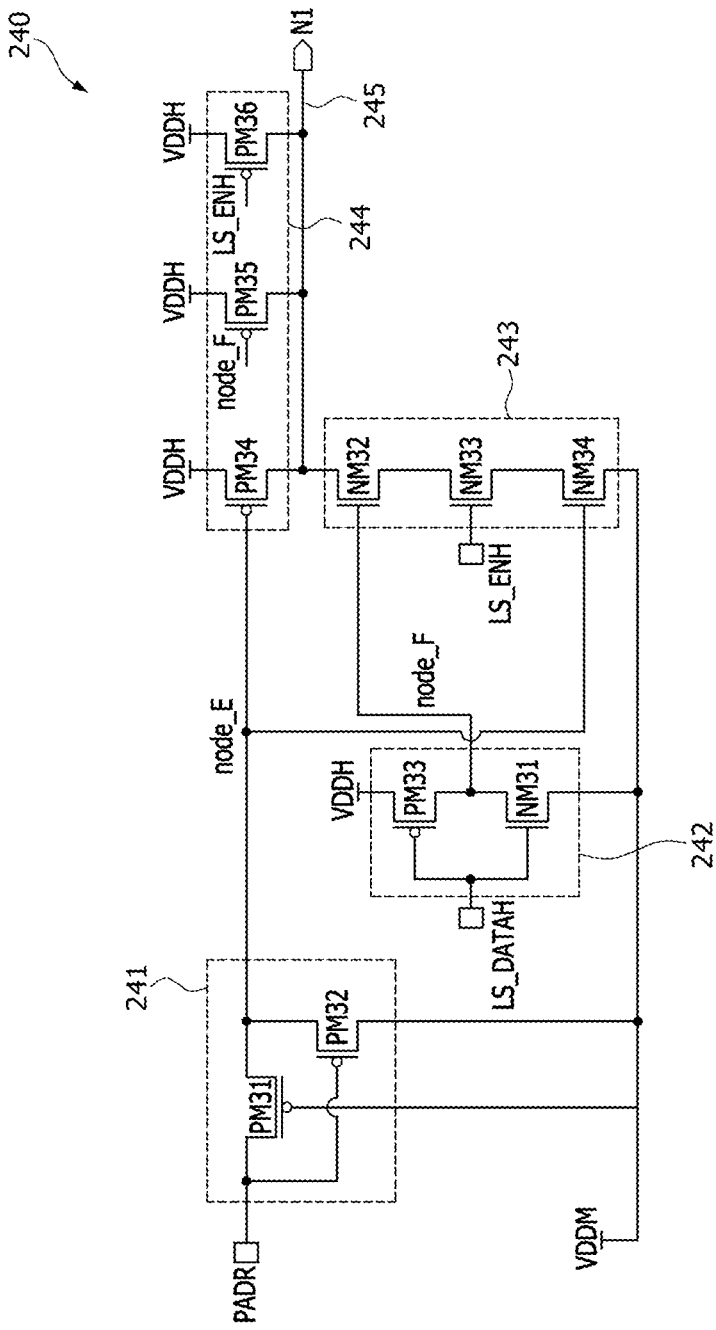
FIG. 7 is a circuit diagram illustrating an example of a second pad status detection logic circuit included in the high voltage output driver of FIG. 3.

FIG. 7 is a circuit diagram illustrating an example of the second pad status detection logic circuit 240 included in the high voltage output driver 200 of FIG. 3. Referring to FIGS. 3 and 7, the second pad status detection logic circuit 240 may output the medium voltage VDDM or the high voltage VDDH as the second pad status detection signal N1 through an output terminal 245, in response to the pad signal PADR, the second level-shifted data signal LS_DATAH and the second level-shifted enablement control signal LS_ENH. In order to realize the above function of the second driver boosting control logic circuit 240, the second driver boosting control logic circuit 240 may be configured to include a first node bias setting unit 241, a second node bias setting unit 242, a first switching unit 243 for outputting the medium voltage VDDM, and a second switching unit 244 for outputting the high voltage VDDH.

The first node bias setting unit 241 may be configured to include a first PMOS transistor PM31 and a second PMOS transistor PM32. The pad signal PADR may be applied to a source of the first PMOS transistor PM31 and a gate of the second PMOS transistor PM32. A gate of the first PMOS transistor PM31 and a source of the second PMOS transistor PM32 may be coupled to the medium voltage VDDM terminal. Drains of the first and second PMOS transistors PM31 and PM32 may be coupled to a node NODE_E. If the pad signal PADR has a voltage level between the ground voltage and the medium voltage VDDM, the first PMOS transistor PM31 may be turned off and the second PMOS transistor PM32 may be turned on. Thus, the medium voltage VDDM may be applied to the node NODE_E. If the pad signal PADR has a voltage level between the medium voltage VDDM and the high voltage VDDH, the first PMOS transistor PM31 may be turned on and the second PMOS transistor PM32 may be turned off. Thus, substantially the same voltage as the pad signal PADR may be applied to the node NODE_E.

The second node bias setting unit 242 may be configured to include a third PMOS transistor PM33 and a first NMOS transistor NM31 which are coupled in series between the high voltage VDDH terminal and the medium voltage VDDM terminal. The second level-shifted data signal LS_DATAH outputted from the third level shifter (LS3) 283 may be applied to gates of the third PMOS transistor PM33 and the first NMOS transistor NM31. A source and a drain of the third PMOS transistor PM33 may be coupled to the high voltage VDDH terminal and a node NODE_F, respectively. A source and a drain of the first NMOS transistor NM31 may be coupled to medium voltage VDDM terminal and the node NODE_F, respectively. If the second level-shifted data signal LS_DATAH is a low level signal having the medium voltage VDDM, the third PMOS transistor PM33 may be turned on and the first NMOS transistor NM31 may be turned off. Thus, the high voltage VDDH may be applied to the node NODE_F. In contrast, if the second level-shifted data signal LS_DATAH is a high level signal having the high voltage VDDH, the third PMOS transistor PM33 may be turned off and the first NMOS transistor NM31 may be turned on. Thus, the medium voltage VDDM may be applied to the node NODE_F.

The first switching unit 243 for supplying the medium voltage VDDM may be configured to include a second NMOS transistor NM32, a third NMOS transistor NM33 and a fourth NMOS transistor NM34 which are coupled in series between the output terminal 245 and the medium voltage VDDM terminal. A gate of the second NMOS transistor NM32 may be coupled to the node NODE_F. The second level-shifted enablement control signal LS_ENH outputted from the fourth level shifter (LS4) 284 may be applied to a gate of the third NMOS transistor NM33. A gate of the fourth NMOS transistor NM34 may be coupled to the node NODE_E. A source and a drain of the second NMOS transistor NM32 may be coupled to a drain of the third NMOS transistor NM33 and the output terminal 245, respectively. A source of the third NMOS transistor NM33 may be coupled to a drain of the fourth NMOS transistor NM34. A source of the fourth NMOS transistor NM34 may be coupled to the medium voltage VDDM terminal.

The second switching unit 244 for supplying the high voltage VDDH may be configured to include a fourth PMOS transistor PM34, a fifth PMOS transistor PM35 and a sixth PMOS transistor PM36 which are coupled in parallel between the high voltage VDDH terminal and the output terminal 245. A gate of the fourth PMOS transistor PM34 may be coupled to the node NODE_E. A gate of the fifth PMOS transistor PM35 may be coupled to the node NODE_F. The second level-shifted enablement control signal LS_ENH may be applied to a gate of the sixth PMOS transistor PM36. Sources of the fourth to fifth PMOS transistors PM34, PM35 and PM36 may be coupled to the high voltage VDDH terminal. Drains of the fourth to fifth PMOS transistors PM34, PM35 and PM36 may be coupled to the output terminal 245.

FIG. 8 is a circuit diagram illustrating an example of the second driver boosting control logic circuit 260 included in the high voltage output driver 200 of FIG. 3. Referring to FIGS. 3 and 8, the second driver boosting control logic circuit 260 may be driven by the medium voltage VDDM and the high voltage VDDH. The second driver boosting control logic circuit 260 may output the second bias control signal N_bias in response to the second pad status detection signal N1. In order to realize the above function of the second driver boosting control logic circuit 260, the second driver boosting control logic circuit 260 may be configured to include a virtual floating P-well bias (hereinafter, referred to as 'VFP') generator 261, a first switching unit 262 for supplying the medium voltage VDDM, a second switching unit 263 for supplying the high voltage VDDH, and an inverter 264.

The VFP generator 261 may be configured to include a first PMOS transistor PM41 and a second PMOS transistor PM42 which are coupled in series between the high voltage VDDH terminal and the medium voltage VDDM terminal. The medium voltage VDDM may be applied to a gate of the first PMOS transistor PM41. The high voltage VDDH may be applied to a gate of the second PMOS transistor PM42. The high voltage VDDH may be applied to a source of the first PMOS transistor PM41. The medium voltage VDDM may be applied to a drain of the second PMOS transistor PM42. A drain of the first PMOS transistor PM41 and a source of the second PMOS transistor PM42 may be coupled to each other to act as an output terminal. The VFP generator 261 may output a VFP voltage through the output terminal of the VFP generator 261. While the first PMOS transistor PM41 is turned on because the medium voltage VDDM is applied to a gate of the first PMOS transistor PM41, the second PMOS transistor PM42 may be turned off because the high voltage VDDH is applied to a gate of the second PMOS transistor PM42. Thus, the VFP voltage may always have the high voltage VDDH.

At an initialization step of the high voltage output driver 200, that is, at a point of time that a certain voltage is applied to an integrated circuit including the high voltage output driver 200, it may be necessary to supply the medium voltage VDDM to the high voltage output driver 200 before the high voltage VDDH is supplied to the high voltage output driver 200. This is for promoting the reliability of the low voltage devices for the medium voltage VDDM operation. Thus, the high voltage VDDH may be supplied to the integrated circuit including the high voltage output driver 200 after the medium voltage VDDM is supplied to the integrated circuit including the high voltage output driver 200 and ramps up to stabilize the high voltage output driver

200. Accordingly, if the medium voltage VDDM is supplied to high voltage output driver 200 without supply of the high voltage VDDH, the first PMOS transistor PM41 may be turned off and the second PMOS transistor PM42 may be turned on. As a result, the VFP may be set to have the medium voltage VDDM. Thereafter, if the high voltage VDDH is supplied to the high voltage output driver 200, the VFP generator 261 may normally output the high voltage VDDH as the VFP.

The first switching unit 262 for supplying the medium voltage VDDM may be configured to include a first NMOS transistor NM41 and a third PMOS transistor PM43 which are coupled in parallel between an output terminal 265 through which the second bias control signal N_bias is outputted and the medium voltage VDDM terminal. The second pad status detection signal N1 may be applied to a gate of the first NMOS transistor NM41. A gate of the third PMOS transistor PM43 may be coupled to an output terminal of the inverter 264. A source of the first NMOS transistor NM41 and a drain of the third PMOS transistor PM43 may be coupled to the medium voltage VDDM terminal. A drain of the first NMOS transistor NM41 and a source of the third PMOS transistor PM43 may be coupled to the output terminal 265. If any one of the first NMOS transistor NM41 and the third PMOS transistor PM43 is turned on, the medium voltage VDDM may be outputted as the second bias control signal N_bias through the output terminal 265.

The second switching unit 263 for supplying the high voltage VDDH may be realized using a fourth PMOS transistor PM44. The second pad status detection signal N1 may be applied to a gate of the fourth PMOS transistor PM44. A source of the fourth PMOS transistor PM44 may be coupled to the output terminal of the VFP generator 261 that outputs the VFP voltage. A drain of the fourth PMOS transistor PM44 may be coupled to the output terminal 265 through which the second bias control signal N_bias is outputted. If the fourth PMOS transistor PM44 is turned on, the VFP having the high voltage VDDH may be outputted as the second bias control signal N_bias through the output terminal 265.

The inverter 264 may be configured to include a fifth PMOS transistor PM45 and a second NMOS transistor NM42 which are coupled in series between the high voltage VDDH terminal and the medium voltage VDDM terminal. The second pad status detection signal N1 may be applied to gates of the fifth PMOS transistor PM45 and the second NMOS transistor NM42. The high voltage VDDH may be applied to a source of the fifth PMOS transistor PM45, and the medium voltage VDDM may be applied to a source of the second NMOS transistor NM42. Drains of the fifth PMOS transistor PM45 and the second NMOS transistor NM42 may be coupled to each other to constitute an output terminal of the inverter 264. If the second pad status detection signal N1 has the high voltage VDDH, the inverter 264 may output the medium voltage VDDM. In contrast, if the second pad status detection signal N1 has the medium voltage VDDM, the inverter 264 may output the high voltage VDDH. If the first switching unit 262 is realized without the third PMOS transistor PM43, the second driver boosting control logic circuit 260 may be realized without the inverter 264.

Figure 9:
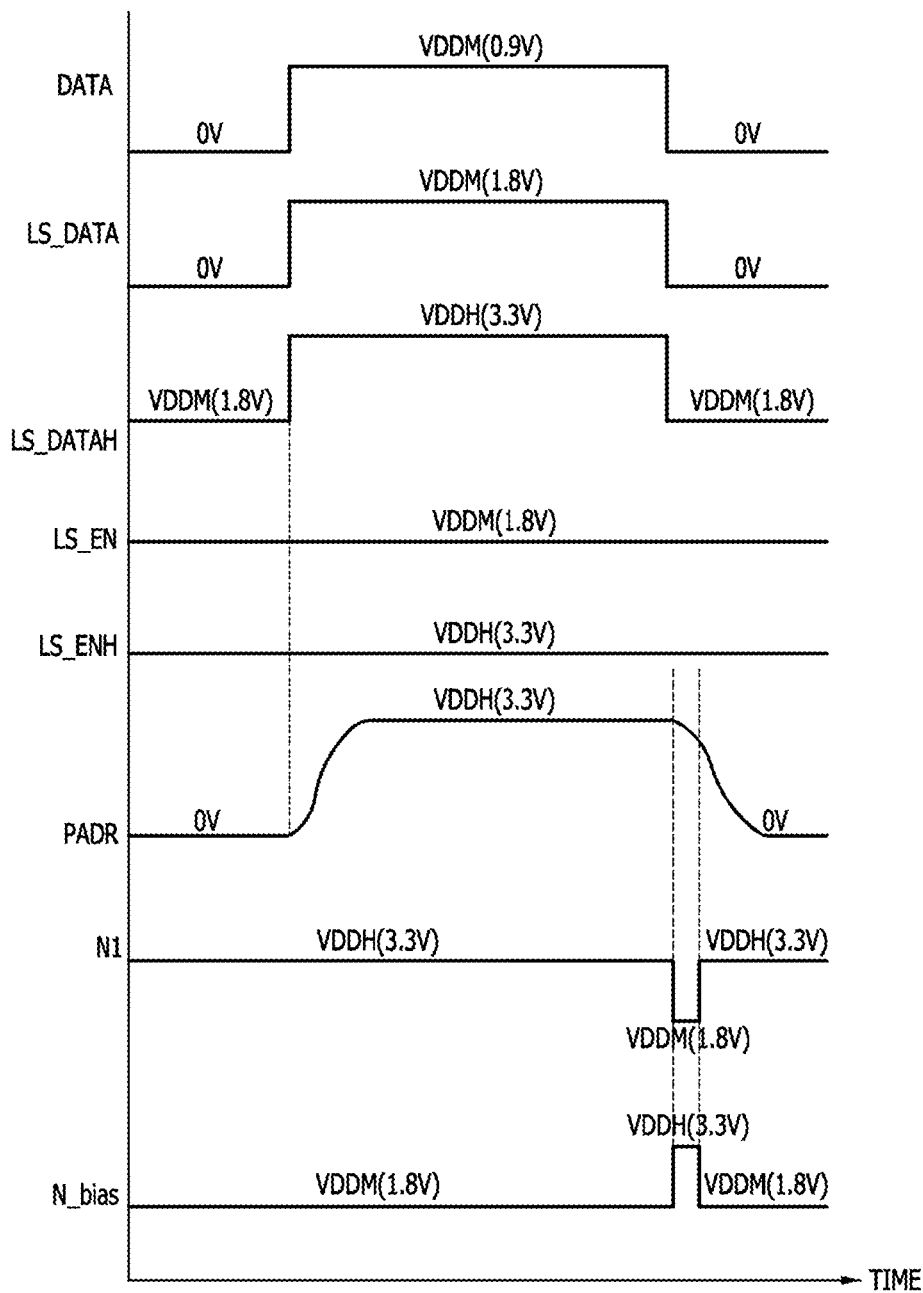
FIG. 9 is a timing diagram illustrating an operation of the second pad status detection logic circuit illustrated in FIG.

FIG. 9 is a timing diagram illustrating an operation of the second pad status detection logic circuit 240 illustrated in FIG. 7 and an operation of the second driver boosting control logic circuit 260 illustrated in FIG. 8. The operations of the second pad status detection logic circuit 240 and the second driver boosting control logic circuit 260 will be described in conjunction with an example in which the low voltage VDDL, the medium voltage VDDM and the high voltage VDDH are 0.9 volts, 1.8 volts and 3.3 volts, respectively. Referring to FIGS. 3, 7, 8 and 9, if the data signal DATA is a low level signal having the ground voltage of 0 volts, the first level-shifted data signal LS_DATA outputted from the first level shifter (LS1) 281 may have the ground voltage of 0 volts and the second level-shifted data signal LS_DATAH outputted from the third level shifter (LS3) 283 may have a low level signal having the medium voltage VDDM. Meanwhile, the enablement control signal EN may be a high level signal for an operation of the high voltage output driver 200. Thus, the first level-shifted enablement control signal LS_EN outputted from the second level shifter (LS2) 282 may have the medium voltage VDDM of 1.8 volts, and the second level-shifted enablement control signal LS_ENH outputted from the fourth level shifter (LS4) 284 may have the high voltage VDDH of 3.3 volts.

If the data signal DATA is a low level signal and a voltage of the pad 205 is the ground voltage of 0 volts, the first PMOS transistor PM31 and the second PMOS transistor PM32 in the first node bias setting unit 241 of the second pad status detection logic circuit 240 illustrated in FIG. 7 may be respectively turned off and turned on because the pad signal PADR has the ground voltage of 0 volts. Thus, the node NODE_E may have the medium voltage VDDM of 1.8 volts. Since the second level-shifted data signal LS_DATAH has the medium voltage VDDM of 1.8 volts, the third PMOS transistor PM33 and the first NMOS transistor NM31 in the second node bias setting unit 242 may be respectively turned on and turned off. As a result, the node NODE_F may have the high voltage VDDH of 3.3 volts.

Since the node NODE_E in the second pad status detection logic circuit 240 has the medium voltage VDDM of 1.8 volts, the fourth NMOS transistor NM34 in the first switching unit 243 for supplying the medium voltage VDDM may be turned off and the fourth PMOS transistor PM34 in the second switching unit 244 for supplying the high voltage VDDH may be turned on. Because the node NODE_F in the second pad status detection logic circuit 240 has the high voltage VDDH of 3.3 volts, the second NMOS transistor NM32 in the first switching unit 243 for supplying the medium voltage VDDM may be turned on and the fifth PMOS transistor PM35 in the second switching unit 244 for supplying the high voltage VDDH may be turned off. Since the second level-shifted enablement control signal LS_ENH has the high voltage VDDH of 3.3 volts, the third NMOS transistor NM33 in the first switching unit 243 for supplying the medium voltage VDDM may be turned on and the sixth PMOS transistor PM36 in the second switching unit 244 for supplying the high voltage VDDH may be turned off.

Since the fourth NMOS transistor NM34 in the first switching unit 243 for supplying the medium voltage VDDM is turned off, the output terminal 245 may be electrically disconnected from the medium voltage VDDM terminal. In contrast, since the fourth PMOS transistor PM34 in the second switching unit 244 for supplying the high voltage VDDH is turned on, the high voltage VDDH of 3.3 volts may be outputted as the second pad status detection signal N1 through the output terminal 245.

If the second pad status detection signal N1 having the high voltage VDDH of 3.3 volts is inputted to the second driver boosting control logic circuit 260, the first NMOS transistor NM41 in the first switching unit 262 for supplying the medium voltage VDDM may be turned on and the fourth PMOS transistor PM44 in the second switching unit 263 for supplying the high voltage VDDH may be turned off. Thus, the medium voltage VDDM of 1.8 volts may be outputted as the second bias control signal N_bias through the output terminal 265.

Meanwhile, the fifth PMOS transistor PM45 in the inverter 264 may be turned off, and the second NMOS transistor NM42 in the inverter 264 may be turned on. Thus, the inverter 264 may output the medium voltage VDDM of 1.8 volts, and the medium voltage VDDM of 1.8 volts may be applied to a gate of the third PMOS transistor PM43 in the first switching unit 262 for supplying the medium voltage VDDM. Ideally, the third PMOS transistor PM43 is not turned on. However, actually, a voltage level of a gate of the third PMOS transistor PM43 may be lower than the medium voltage VDDM because of a voltage drop across an equivalent resistance of the third PMOS transistor PM43. In such a case, the third PMOS transistor PM43 may be turned on. Accordingly, the medium voltage VDDM may be outputted through the output terminal 265 along a path of one of the first NMOS transistor NM41 and the third PMOS transistor PM43, which is firstly turned on.

As described above, while the data signal DATA has a voltage corresponding to a low level signal and the pad signal PADR has the ground voltage together with the enablement control signal EN corresponding to a high level signal, the second gate control signal NG having the medium voltage VDDM of 1.8 volts may be applied to a gate of the first NMOS transistor NM1 in the pull-down driver 220 and the second bias control signal N_bias having the medium voltage VDDM of 1.8 volts may be applied to a gate of the second NMOS transistor NM2 in the pull-down driver 220. Thus, both of the first and second NMOS transistors NM1 and NM2 are turned on to activate the pull-down driver 220.

If the data signal DATA changes from a low level signal into a high level signal, the first level-shifted data signal LS_DATA outputted from the first level shifter (LS1) 281 may have the medium voltage VDDM of 1.8 volts. The second level-shifted data signal LS_DATAH outputted from the third level shifter (LS3) 283 may be a high level signal having the high voltage of 3.3 volts. Thus, the node NODE_F corresponding to an output terminal of the second node bias setting unit 242 in the second pad status detection logic circuit 240 may have the medium voltage VDDM of 1.8 volts. Accordingly, the second NMOS transistor NM32 of the first switching unit 243 for supplying the medium voltage VDDM may be turned off, and the fifth PMOS transistor PM35 of the second switching unit 244 for supplying the high voltage VDDH may be turned on.

The enablement control signal EN may maintain a high level signal for an operation of the high voltage output driver 200. Thus, the first level-shifted enablement control signal LS_EN outputted from the second level shifter (LS2) 282 may maintain the medium voltage VDDM of 1.8 volts. The second level-shifted enablement control signal LS_ENH outputted from the fourth level shifter (LS4) 284 may maintain the high voltage VDDH of 3.3 volts. Accordingly, the third NMOS transistor NM33 of the first switching unit 243 for supplying the medium voltage VDDM may be turned on, and the sixth PMOS transistor PM36 of the second switching unit 244 for supplying the high voltage VDDH may be turned off.

While both of the data signal DATA and the enablement control signal EN are high level signals and the pad signal PADR is initiated to change from the ground voltage of 0 volts to the high voltage VDDH of 3.3 volts, the second NMOS transistor NM32 of the second pad status detection logic circuit 240 may still be turned off and the fifth PMOS transistor PM35 of the second pad status detection logic circuit 240 may still be turned on. Thus, the second pad status detection signal N1 may maintain the high voltage VDDH of 3.3 volts regardless of a voltage of the node NODE_E, that is, a voltage of the pad signal PADR. This status may be maintained while the pad signal PADR is changed to have the high voltage VDDH of 3.3 volts.

If the data signal DATA changes from a high level signal into a low level signal, the first level-shifted data signal LS_DATA outputted from the first level shifter (LS1) 281 may return to the ground voltage of 0 volts. The second level-shifted data signal LS_DATAH outputted from the third level shifter (LS3) 283 may return to a low level signal, that is, the medium voltage VDDM of 1.8 volts. Thus, the node NODE_F corresponding to an output terminal of the second node bias setting unit 242 in the second pad status detection logic circuit 240 may have the high voltage VDDM of 3.3 volts. Accordingly, the second NMOS transistor NM32 of the first switching unit 243 for supplying the medium voltage VDDM may be turned on, and the fifth PMOS transistor PM35 of the second switching unit 244 for supplying the high voltage VDDH may be turned off.

The enablement control signal EN may maintain a high level signal for an operation of the high voltage output driver 200. Thus, the first level-shifted enablement control signal LS_EN outputted from the second level shifter (LS2) 282 may maintain the medium voltage VDDM of 1.8 volts, and the second level-shifted enablement control signal LS_ENH outputted from the fourth level shifter (LS4) 284 may maintain the high voltage VDDH of 3.3 volts. Accordingly, the third NMOS transistor NM33 of the first switching unit 243 for supplying the medium voltage VDDM may be turned on, and the sixth PMOS transistor PM36 of the second switching unit 244 for supplying the high voltage VDDH may be turned off.

While both of the data signal DATA and the enablement control signal EN are high level signals and the pad signal PADR is changed from the high voltage VDDH of 3.3 volts to the ground voltage of 0 volts, the second NMOS transistor NM32 of the second pad status detection logic circuit 240 may still be turned on and the fifth PMOS transistor PM35 of the second pad status detection logic circuit 240 may still be turned off. In addition, the third NMOS transistor NM33 of the second pad status detection logic circuit 240 may still be turned on and the sixth PMOS transistor PM36 of the second pad status detection logic circuit 240 may still be turned off. Thus, a voltage level of the second pad status detection signal N1 may be set according to a voltage of the node NODE_E which is coupled to gates of the fourth NMOS transistor NM34 and the fourth PMOS transistor PM34.

As the data signal DATA changes from a high level signal into a low level signal, a voltage of the node NODE_E may be lowered like the pad signal PADR and may maintain the medium voltage VDDM of 1.8 volts from a certain point of time while the pad signal PADR is changed from the high voltage VDDH of 3.3 volts to the ground voltage of 0 volts. That is, if the first PMOS transistor PM31 and the second PMOS transistor PM32 in the first node bias setting unit 241 are respectively turned on and turned off by the pad signal PADR higher than the medium voltage VDDM of 1.8 volts, the node NODE_E may have the same voltage as the pad signal PADR. Thereafter, if the first PMOS transistor PM31 and the second PMOS transistor PM32 in the first node bias setting unit 241 are respectively turned off and turned on by the pad signal PADR lower than the medium voltage VDDM of 1.8 volts, the node NODE_E may maintain the medium voltage VDDM of 1.8 volts.

At an initialization step that the pad signal PADR is initiated to change from 3.3 volts to 0 volts, that is, while the node NODE_E has a voltage close to 3.3 volts, the fourth PMOS transistor PM34 may still be turned off and the fourth NMOS transistor NM34 may be turned on. Thus, the medium voltage VDDM of 1.8 volts may be outputted as the second pad status detection signal N1. If a voltage level of the pad signal PADR is continuously lowered to reach the medium voltage VDDM of 1.8 volts, the fourth NMOS transistor NM34 may be turned off and the fourth PMOS transistor PM34 may be turned on. Accordingly, the high voltage VDDH of 3.3 volts may be outputted as the second pad status detection signal N1 again.

While the medium voltage VDDM of 1.8 volts is outputted as the second pad status detection signal N1, that is, while the pad signal PADR still has a voltage close to 3.3 volts even though the data signal DATA temporally changes to a low level signal, the medium voltage VDDM of 1.8 volts may be outputted as the second pad status detection signal N1. Thus, the fourth PMOS transistor PM44 of the second switching unit 263 for supplying the high voltage VDDH may be turned on to amplify the second bias control signal N_bias, which is outputted through the output terminal 265 of the second driver boosting control logic circuit 260, into the high voltage VDDH of 3.3 volts. Thereafter, if the high voltage VDDH of 3.3 volts is outputted as the second pad status detection signal N1, the first NMOS transistor NM41 in the first switching unit 262 for supplying the medium voltage VDDM may be turned on to output the medium voltage VDDM of 1.8 volts as the second bias control signal N_bias through the output terminal 265 of the second driver boosting control logic circuit 260.

FIG. 10 is a circuit diagram illustrating voltages applied between terminals of the first and second NMOS transistors NM1 and NM2 constituting the pull-down driver 220 included in the high voltage output driver 200 of FIG. 3, when the data signal DATA is a low level signal and the pad signal PADR maintains the ground voltage. In FIG. 10, the same reference designators as used in FIG. 3 denote the same elements. Referring to FIG. 10, while the data signal DATA is a low level signal and the pad signal PADR maintains the ground voltage of 0 volts, the pull-up driver 210 of the high voltage output driver 200 may maintain an inactivated status and the pull-down driver 220 of the high voltage output driver 200 may maintain an activated status. The first gate control signal PG having the high voltage VDDH of 3.3 volts may be applied to a gate of the first PMOS transistor PM1 of the pull-up driver 210 which is inactivated. As illustrated in FIG. 6, the first bias control signal P_bias having the medium voltage VDDM of 1.8 volts may be applied to a gate of the second PMOS transistor PM2 of the pull-up driver 210 which is inactivated. The second gate control signal NG having the medium voltage VDDM of 1.8 volts may be applied to a gate of the first NMOS transistor NM1 of the pull-down driver 220 which is activated. As illustrated in FIG. 9, the second bias control signal N_bias having the medium voltage VDDM of 1.8 volts may be applied to a gate of the second NMOS transistor NM2 of the pull-down driver 220 which is activated.

Under an assumption that a threshold voltage Vtnm2 of the second NMOS transistor NM2 is about 0.4 volts, a voltage of the node NODE_B between the first and second NMOS transistor NM1 and NM2 may be about 1.4 volts. Thus, a gate-to-drain voltage Vgd, a gate-to-source voltage Vgs and a drain-to-source voltage Vds of the first NMOS transistor NM1 may be 0.4 volts, 1.8 volts and 1.4 volts, respectively. Accordingly, when the pull-down driver 220 operates, a voltage lower than the reliability guarantee voltage of 1.98 volts may be applied between the terminals of the first NMOS transistor NM1. A gate-to-drain voltage Vgd, a gate-to-source voltage Vgs and a drain-to-source voltage Vds of the second NMOS transistor NM2 may be 1.8 volts, 0.4 volts and 1.4 volts, respectively. Accordingly, when the pull-down driver 220 operates, a voltage lower than the reliability guarantee voltage of 1.98 volts may be applied between the terminals of the second NMOS transistor NM2.

FIGS. 11 and 12 are circuit diagrams illustrating voltages applied between terminals of the first and second PMOS transistors PM1 and PM2 constituting the pull-up driver 210 included in the high voltage output driver 200 of FIG. 3, while the data signal DATA changes from a low level signal into a high level signal and the pad signal PADR changes from a ground voltage into a high voltage. In FIGS. 11 and 12, the same reference designators as used in FIG. 3 denote the same elements. FIG. 11 illustrates voltages applied between terminals of the first and second PMOS transistors PM1 and PM2 constituting the pull-up driver 210 when the pad signal PADR has a voltage (e.g., 0.5 volts) close to the ground voltage while the pad signal PADR is initiated to change from the ground voltage of 0 volts to the high voltage VDDH of 3.3 volts. FIG. 12 illustrates voltages applied between terminals of the first and second PMOS transistors PM1 and PM2 constituting the pull-up driver 210 when the pad signal PADR has a voltage higher than the medium voltage of 1.8 volts while the pad signal PADR is initiated to change from the ground voltage of 0 volts to the high voltage VDDH of 3.3 volts.

Referring to FIGS. 11 and 12, as the data signal DATA changes from a low level signal into a high level signal, the pull-up driver 210 may be activated and the pull-down driver 220 may be inactivated. First, as illustrated in FIG. 11, if the pad signal PADR still has a voltage (e.g., 0.5 volts) close to the ground voltage while the pad signal PADR is changed, the second gate control signal NG having the ground voltage of 0 volts may be applied to a gate of the first NMOS transistor NM1 of the pull-down driver 220 which is inactivated. In addition, as described with reference to FIG. 9, the second bias control signal N_bias having the medium voltage VDDM of 1.8 volts may be applied to a gate of the second NMOS transistor NM2 of the pull-down driver 220 which is inactivated. The first gate control signal PG having a voltage of 1.72 volts (corresponding to a sum of the first external bias voltage Vbias1 and a threshold voltage of the PMOS transistors included in the third level shifter (LS3) 283) may be applied to a gate of the first PMOS transistor PM1 of the pull-up driver 210 which is activated. Moreover, as described with reference to FIG. 6, the first bias control signal P_bias having the ground voltage of 0 volts, which is temporally lowered, may be applied to a gate of the second PMOS transistor PM2 of the pull-up driver 210 which is activated.

Although the ground voltage of 0 volts is applied to a gate of the second PMOS transistor PM2, a voltage of the node NODE_A between the first and second PMOS transistors PM1 and PM2 may be lowered to have about 1.7 volts because the first PMOS transistor PM1 is turned on. Thus, a gate-to-drain voltage Vgd, a gate-to-source voltage Vgs and a drain-to-source voltage Vds of the first PMOS transistor PM1 may be 0.02 volts, 1.58 volts and 1.6 volts, respectively. Accordingly, when the pull-up driver 210 operates, a voltage lower than the reliability guarantee voltage of 1.98 volts may be applied between the terminals of the first PMOS transistor PM1. A gate-to-drain voltage Vgd, a gate-to-source voltage Vgs and a drain-to-source voltage Vds of the second PMOS transistor PM2 may be 0.5 volts, 1.7 volts and 1.2 volts, respectively. Accordingly, when the pull-up driver 210 operates, a voltage lower than the reliability guarantee voltage of 1.98 volts may be applied between the terminals of the second PMOS transistor PM2.

Next, as illustrated in FIG. 12, if the pad signal PADR has a voltage level (e.g., 2.8 volts) over the medium voltage VDDM of 1.8 volts while the pad signal PADR is changed, the first gate control signal PG having a voltage of 1.72 volts (corresponding to a sum of the first external bias voltage Vbias1 and a threshold voltage of the PMOS transistors included in the third level shifter (LS3) 283) may be applied to a gate of the first PMOS transistor PM1 in the pull-up driver 210 which is activated. In addition, as described with reference to FIG. 6, the first bias control signal P_bias having the second external bias voltage Vbias2 of 1.32 volts may be applied to a gate of the second PMOS transistor PM2 in the pull-up driver 210 which is activated.

The node NODE_A between the first and second PMOS transistors PM1 and PM2 may have a voltage of about 1.72 volts corresponding to a sum of the second external bias voltage Vbias2 and a threshold voltage of the second PMOS transistor PM2. Thus, a gate-to-drain voltage Vgd, a gate-to-source voltage Vgs and a drain-to-source voltage Vds of the first PMOS transistor PM1 may be 0 volts, 1.58 volts and 1.58 volts, respectively. Accordingly, when the pull-up driver 210 operates, a voltage lower than the reliability guarantee voltage of 1.98 volts may be applied between the terminals of the first PMOS transistor PM1. A gate-to-drain voltage Vgd, a gate-to-source voltage Vgs and a drain-to-source voltage Vds of the second PMOS transistor PM2 may be 1.48 volts, 0.4 volts and 1.08 volts, respectively. Accordingly, when the pull-up driver 210 operates, a voltage lower than the reliability guarantee voltage of 1.98 volts may be applied between the terminals of the second PMOS transistor PM2.

FIG. 13 is a circuit diagram illustrating voltages applied between terminals of the first and second PMOS transistors PM1 and PM2 constituting the pull-up driver 210 included in the high voltage output driver 200 of FIG. 3 when the data signal DATA maintains a high level signal and the pad signal PADR maintains a high voltage. In FIG. 13, the same reference designators as used in FIG. 3 denote the same elements. Referring to FIG. 13, while the data signal DATA is a high level signal and the pad signal PADR maintains the high voltage of 3.3 volts, the pull-down driver 220 of the high voltage output driver 200 may maintain an inactivated status and the pull-up driver 210 of the high voltage output driver 200 may maintain an activated status. The second gate control signal NG having the ground voltage of 0 volts may be applied to a gate of the first NMOS transistor NM1 of the pull-down driver 220 which is inactivated. In addition, as described with reference to FIG. 9, the second bias control signal N_bias having the medium voltage VDDM of 1.8 volts may be applied to a gate of the second NMOS transistor NM2 of the pull-down driver 220 which is inactivated. The first gate control signal PG having a voltage of 1.72 volts (corresponding to a sum of the first external bias voltage Vbias1 and a threshold voltage of the PMOS transistors included in the third level shifter (LS3) 283) may be applied to a gate of the first PMOS transistor PM1 of the pull-up driver 210 which is activated. Moreover, as described with reference to FIG. 6, the first bias control signal P_bias having the second external bias voltage Vbias2 of 1.32 volts may be applied to a gate of the second PMOS transistor PM2 in the pull-up driver 210 which is activated.

The node NODE_A between the first and second PMOS transistors PM1 and PM2 may maintain a voltage of about 1.72 volts corresponding to a sum of the voltage of 1.32 volts applied to a gate of the second PMOS transistor PM2 and a threshold voltage (i.e., 0.4 volts) of the second PMOS transistor PM2. Thus, a gate-to-drain voltage Vgd, a gate-to-source voltage Vgs and a drain-to-source voltage Vds of the first PMOS transistor PM1 may be 0 volts, 1.58 volts and 1.58 volts, respectively. Accordingly, when the pull-up driver 210 operates, a voltage lower than the reliability guarantee voltage of 1.98 volts may be applied between the terminals of the first PMOS transistor PM1. A gate-to-drain voltage Vgd, a gate-to-source voltage Vgs and a drain-to-source voltage Vds of the second PMOS transistor PM2 may be 1.98 volts, 0.4 volts and 1.58 volts, respectively. Accordingly, when the pull-up driver 210 operates, a voltage equal to or lower than the reliability guarantee voltage of 1.98 volts may be applied between the terminals of the second PMOS transistor PM2.

FIGS. 14 and 15 are circuit diagrams illustrating voltages applied between terminals of the first and second NMOS transistors NM1 and NM2 constituting the pull-down driver 220 included in the high voltage output driver 200 of FIG. 3, while the data signal DATA changes from a high level signal into a low level signal and the pad signal PADR changes from the high voltage VDDH into the ground voltage. In FIGS. 14 and 15, the same reference designators as used in FIG. 3 denote the same elements. FIG. 14 illustrates voltages applied between terminals of the first and second NMOS transistors NM1 and NM2 constituting the pull-down driver 220 when the pad signal PADR has a voltage (e.g., 3.0 volts) close to the high voltage VDDH of 3.3 volts while the pad signal PADR is changed from the high voltage VDDH of 3.3 volts to the ground voltage of 0 volts. FIG. 15 illustrates voltages applied between terminals of the first and second NMOS transistors NM1 and NM2 constituting the pull-down driver 220 when the pad signal PADR has a voltage lower than the medium voltage of 1.8 volts while the pad signal PADR is changed from the high voltage VDDH of 3.3 volts to the ground voltage of 0 volts.

Referring to FIGS. 14 and 15, as the data signal DATA changes from a high level signal into a low level signal, the pull-down driver 220 may be activated and the pull-up driver 210 may be inactivated. First, as illustrated in FIG. 14, if the pad signal PADR still has a voltage (e.g., 3.0 volts) close to the high voltage VDDH while the pad signal PADR is changed, the first gate control signal PG having the high voltage VDDH of 3.3 volts may be applied to a gate of the first PMOS transistor PM1 of the pull-up driver 210 which is inactivated. In addition, as described with reference to FIG. 6, the first bias control signal P_bias having the medium voltage VDDM of 1.8 volts may be applied to a gate of the second PMOS transistor PM2 of the pull-up driver 210 which is inactivated. The second gate control signal NG having the medium voltage VDDM of 1.8 volts may be applied to a gate of the first NMOS transistor NM1 of the pull-down driver 220 which is activated. Moreover, as described with reference to FIG. 9, the second bias control signal N_bias having the high voltage of 3.3 volts, which is temporally amplified, may be applied to a gate of the second NMOS transistor NM2 of the pull-down driver 220 which is activated.

Since the voltage of 3.3 volts, which is temporally amplified, is applied to a gate of the second NMOS transistor NM2, the second NMOS transistor NM2 may be more strongly turned on as compared with the second NMOS transistor NM2 at the previous step. Thus, even though the first NMOS transistor NM1 is turned on, a voltage of the node NODE_B between the first and second NMOS transistors NM1 and NM2 may increase to have about 1.9 volts. Accordingly, a gate-to-drain voltage Vgd, a gate-to-source voltage Vgs and a drain-to-source voltage Vds of the first NMOS transistor NM1 may be 0 volts, 1.8 volts and 1.8 volts, respectively. Accordingly, when the pull-down driver 220 operates, a voltage lower than the reliability guarantee voltage of 1.98 volts may be applied between the terminals of the first NMOS transistor NM1. A gate-to-drain voltage Vgd, a gate-to-source voltage Vgs and a drain-to-source voltage Vds of the second NMOS transistor NM2 may be 0.3 volts, 1.4 volts and 1.1 volts, respectively. Accordingly, when the pull-down driver 220 operates, a voltage lower than the reliability guarantee voltage of 1.98 volts may be applied between the terminals of the second NMOS transistor NM2.

Next, as illustrated in FIG. 15, if the pad signal PADR has a voltage level (e.g., 0.5 volts) lower the medium voltage VDDM of 1.8 volts while the pad signal PADR is changed, the second gate control signal NG applied to a gate of the first NMOS transistor NM1 may maintain the medium voltage VDDM of 1.8 volts. In addition, as described with reference to FIG. 9, the first bias control signal P_bias having the medium voltage VDDM of 1.8 volts may be applied to a gate of the second PMOS transistor PM2 in the pull-up driver 210 which is inactivated.

If a threshold voltage of the second NMOS transistor NM2 is about 0.4 volts, the node NODE_B between the first and second NMOS transistors NM1 and NM2 may have a voltage of about 1.4 volts. Thus, a gate-to-drain voltage Vgd, a gate-to-source voltage Vgs and a drain-to-source voltage Vds of the first NMOS transistor NM1 may be 0.4 volts, 1.8 volts and 1.4 volts, respectively. Accordingly, when the pull-down driver 220 operates, a voltage lower than the reliability guarantee voltage of 1.98 volts may be applied between the terminals of the first NMOS transistor NM1. A gate-to-drain voltage Vgd, a gate-to-source voltage Vgs and a drain-to-source voltage Vds of the second NMOS transistor NM2 may be 1.3 volts, 0.4 volts and 0.9 volts, respectively. Accordingly, when the pull-down driver 220 operates, a voltage lower than the reliability guarantee voltage of 1.98 volts may be applied between the terminals of the second NMOS transistor NM2.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A high voltage output driver comprising:
 a first main driver and a first bias driver coupled in series between a high voltage terminal and an output terminal to constitute a pull-up driver;
 a second main driver and a second bias driver coupled in series between a ground voltage terminal and the output terminal to constitute a pull-down driver;
 a first pad status detection logic circuit configured to detect a voltage of a pad coupled to the output terminal to generate a first pad status detection signal;
 a second pad status detection logic circuit configured to detect a voltage of the pad coupled to the output terminal to generate a second pad status detection signal;
 a first driver boosting control logic circuit configured to generate a first bias control signal for controlling the first bias driver based on the first pad status detection signal and a data signal; and
 a second driver boosting control logic circuit configured to generate a second bias control signal for controlling the second bias driver based on the second pad status detection signal,
 wherein the first main driver and the first bias driver include a first PMOS transistor and a second PMOS transistor, respectively;
 wherein the second main driver and the second bias driver include a first NMOS transistor and a second NMOS transistor, respectively;
 wherein each of the first and second PMOS transistors and the first and second NMOS transistors is a low voltage transistor for a medium voltage operation; and
 wherein the medium voltage is lower than a high voltage corresponding to a maximum output voltage outputted through the pad,
 the high voltage output driver further comprising:
 a first level shifter configured to shift a level of a data signal to output the medium voltage or a ground voltage as a first level-shifted data signal;
 a second level shifter configured to shift a level of an enablement control signal to output the medium voltage or the ground voltage as a first level-shifted enablement control signal;
 a third level shifter configured to invert and shift a level of the first level-shifted data signal to output the medium voltage or the high voltage as a second level-shifted data signal and to output the high voltage or a first external bias voltage as a first gate control signal applied to a gate of the first PMOS transistor;
 a fourth level shifter configured to shift a level of the first level-shifted enablement control signal to output the high voltage or the first external bias voltage as a second level-shifted enablement control signal; and
 a control logic circuit configured to invert a level of the first level-shifted data signal to output the medium voltage or the ground voltage as a second gate control signal applied to a gate of the first NMOS transistor.

2. The high voltage output driver of claim 1, wherein the first pad status detection logic circuit includes:
 a node bias setting unit configured to set a voltage of a first node based on the pad signal;
 a first switching unit configured to output the medium voltage to a first output terminal based on a voltage of the first node, an inverted signal of the first level-shifted data signal, and an inverted signal of the first level-shifted enablement control signal; and
 a second switching unit configured to output the ground voltage to the first output terminal based on a voltage of the first node, an inverted signal of the first level-shifted data signal, and an inverted signal of the first level-shifted enablement control signal.

3. The high voltage output driver of claim 2,
 wherein the node bias setting unit includes a third NMOS transistor and a fourth NMOS transistor;
 wherein the medium voltage is applied to a gate of the third NMOS transistor, the pad signal is applied to a drain of the third NMOS transistor, and the first node is coupled to a source of the third NMOS transistor; and
 wherein the pad signal is applied to a gate of the fourth NMOS transistor, the medium voltage is applied to a drain of the fourth NMOS transistor, and the first node is coupled to a source of the fourth NMOS transistor.

4. The high voltage output driver of claim 2,
wherein the first switching unit includes a third PMOS transistor, a fourth PMOS transistor and a fifth PMOS transistor which are coupled in series between a medium voltage terminal and the first output terminal;
wherein a voltage of the first node is applied to a gate of the third PMOS transistor;
wherein an inverted signal of the first level-shifted data signal is applied to a gate of the fourth PMOS transistor; and
wherein an inverted signal of the first level-shifted enablement control signal is applied to a gate of the fifth PMOS transistor.

5. The high voltage output driver of claim 2,
wherein the second switching unit includes a fifth NMOS transistor, a sixth NMOS transistor and a seventh NMOS transistor which are coupled in parallel between the first output terminal and the ground voltage terminal;
wherein the first node is coupled to a gate of the fifth NMOS transistor;
wherein an inverted signal of the first level-shifted data signal is applied to a gate of the sixth NMOS transistor; and
wherein an inverted signal of the first level-shifted enablement control signal is applied to a gate of the seventh NMOS transistor.

6. The high voltage output driver of claim 1, wherein the second pad status detection logic circuit includes:
a first node bias setting unit configured to set a voltage of a first node based on the pad signal;
a second node bias setting unit configured to a voltage of a second node based on the second level-shifted data signal;
a first switching unit configured to output the medium voltage to a second output terminal based on a voltage of the first node, a voltage of the second node, and the second level-shifted enablement control signal; and
a second switching unit configured to output the high voltage to the second output terminal based on a voltage of the first node, a voltage of the second node, and the second level-shifted enablement control signal.

7. The high voltage output driver of claim 6, wherein the first node bias setting unit includes:
a sixth PMOS transistor having a gate coupled to a medium voltage terminal, a source receiving the pad signal, and a drain coupled to the first node; and
a seventh PMOS transistor having a gate receiving the pad signal, a source coupled to the medium voltage terminal, and a drain coupled to the first node.

8. The high voltage output driver of claim 6,
wherein the second node bias setting unit includes an eighth PMOS transistor and an eighth NMOS transistor which are coupled in series between the high voltage terminal and a medium voltage terminal; and
wherein the second level-shifted data signal is applied to a gate of the eighth PMOS transistor and a gate of the eighth NMOS transistor.

9. The high voltage output driver of claim 6,
wherein the first switching unit includes a ninth NMOS transistor, a tenth NMOS transistor and an eleventh NMOS transistor which are coupled in series between the second output terminal and a medium voltage terminal;
wherein a voltage of the second node is applied to a gate of the ninth NMOS transistor;
wherein the second level-shifted enablement control signal is applied to a gate of the tenth NMOS transistor; and
wherein a voltage of the first node is applied to a gate of the eleventh NMOS transistor.

10. The high voltage output driver of claim 6,
wherein the second switching unit includes a ninth PMOS transistor, a tenth PMOS transistor and an eleventh PMOS transistor which are coupled in parallel between the high voltage terminal and the second output terminal;
wherein a voltage of the first node is coupled to a gate of the ninth PMOS transistor;
wherein a voltage of the second node is applied to a gate of the tenth PMOS transistor; and
wherein the second level-shifted enablement control signal is applied to a gate of the eleventh PMOS transistor.

11. The high voltage output driver of claim 1, wherein the first driver boosting control logic circuit includes:
a ground voltage supply unit configured to output the ground voltage to a third output terminal or to electrically connect the third output terminal to a first node, based on the first pad status detection signal;
a second external bias supply unit configured to supply a second external bias voltage to the first node based on the first level-shifted data signal, an inverted signal of the first level-shifted data signal, the first level-shifted enablement control signal, and an inverted signal of the first level-shifted enablement control signal; and
a medium voltage supply unit configured to output the medium voltage to the third output terminal based on an inverted signal of the first level-shifted data signal and an inverted signal of the first level-shifted enablement control signal.

12. The high voltage output driver of claim 11,
wherein the ground voltage supply unit includes a twelfth PMOS transistor coupled between the first node and the third output terminal and a twelfth NMOS transistor coupled between the third output terminal and the ground voltage terminal; and
wherein the first pad status detection signal is applied to a gate of the twelfth PMOS transistor and a gate of the twelfth NMOS transistor.

13. The high voltage output driver of claim 11, wherein the second external bias supply unit includes:
a thirteenth PMOS transistor and a fourteenth PMOS transistor which are coupled in series between a second external bias voltage terminal and the first node; and
a thirteenth NMOS transistor and a fourteenth NMOS transistor which are coupled in series between the second external bias voltage terminal and the first node,
wherein the thirteenth NMOS transistor and the thirteenth PMOS transistor are coupled in parallel to the second external bias voltage terminal, and the fourteenth NMOS transistor and the fourteenth PMOS transistor are coupled in parallel to the first node,
wherein an inverted signal of the first level-shifted enablement control signal is applied to a gate of the thirteenth PMOS transistor,
wherein an inverted signal of the first level-shifted data signal is applied to a gate of the fourteenth PMOS transistor,
wherein the first level-shifted enablement control signal is applied to a gate of the thirteenth NMOS transistor, and wherein the first level-shifted data signal is applied to a gate of the fourteenth NMOS transistor.

14. The high voltage output driver of claim 11, wherein the medium voltage supply unit includes:
- a fifteenth PMOS transistor coupled between a medium voltage terminal and the third output terminal; and
- a NOR gate configured to receive an inverted signal of the first level-shifted enablement control signal and an inverted signal of the first level-shifted data signal to output the medium voltage or the ground voltage to a gate of the fifteenth PMOS transistor.

15. The high voltage output driver of claim 1, wherein the second driver boosting control logic circuit includes:
- a virtual floating P-well bias (VFP) generator configured to output the medium voltage as a VFP voltage before the high voltage is supplied while the medium voltage is supplied and configured to output the high voltage as the VFP voltage if both of the medium voltage and the high voltage are supplied;
- a first switching unit configured to output the medium voltage to the fourth output terminal based on the second pad status detection signal; and
- a second switching unit configured to output an output signal of the VFP generator to the fourth output terminal based on the second pad status detection signal.

16. The high voltage output driver of claim 15,
wherein the VFP generator includes a sixteenth PMOS transistor and a seventeenth PMOS transistor which are coupled in series between the high voltage terminal and a medium voltage terminal;
wherein a node between the sixteenth and seventeenth PMOS transistors is coupled to a VFP output terminal;
wherein the medium voltage and the high voltage are applied to a gate of the sixteenth PMOS transistor and a gate of the seventeenth PMOS transistor, respectively.

17. The high voltage output driver of claim 15,
wherein the first switching unit includes a fifteenth NMOS transistor; and
wherein the second pad status detection signal is applied to a gate of the fifteenth NMOS transistor; and
wherein a source and a drain of the fifteenth NMOS transistor are coupled to the medium voltage terminal and the fourth output terminal, respectively.

18. The high voltage output driver of claim 17, further comprising:
- an inverter configured to output the high voltage or the medium voltage based on the second pad status detection signal; and
- an eighteenth PMOS transistor coupled between the fourth output terminal and the medium voltage terminal,
wherein the eighteenth PMOS transistor has a gate receiving an output signal of the inverter.

19. The high voltage output driver of claim 15,
wherein the second switching unit includes a nineteenth PMOS transistor; and
wherein the nineteenth PMOS transistor has a gate receiving the second pad status detection signal, a source receiving the VFP voltage, and a drain coupled to the fourth output terminal.

* * * * *

UNITED STATES PATENT AND TRADEMARK OFFICE
CERTIFICATE OF CORRECTION

PATENT NO. : 10,305,474 B2
APPLICATION NO. : 15/471861
DATED : March 28, 2017
INVENTOR(S) : Seung Ho Lee Page 1 of 1

It is certified that error appears in the above-identified patent and that said Letters Patent is hereby corrected as shown below:

On the Title Page

Item (72) Inventor:
Replace "Seung Ho LEE, Icheon-si (KR)" with --Seung Ho LEE, Seoul (KR)--

Item (73) Assignee:
Replace "SK Hynix Inc., Icheon-si, Gyeonggi-do (KR)" with --SK hynix Inc., Icheon-si Gyeonggi-do (KR)--

Signed and Sealed this
Twenty-third Day of July, 2019

Andrei Iancu
*Director of the United States Patent and Trademark Office*